(12) United States Patent
Edmond et al.

(10) Patent No.: US 9,490,235 B2
(45) Date of Patent: Nov. 8, 2016

(54) LIGHT EMITTING DEVICES, SYSTEMS, AND METHODS

(75) Inventors: John A. Edmond, Durham, NC (US); Hua-Shuang Kong, Cary, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/224,850

(22) Filed: Sep. 2, 2011

(65) Prior Publication Data

US 2012/0193651 A1 Aug. 2, 2012

(51) Int. Cl.
*H01L 33/54* (2010.01)
*H01L 25/075* (2006.01)
*H01L 25/16* (2006.01)
*H01L 33/52* (2010.01)

(52) U.S. Cl.
CPC ......... *H01L 25/0753* (2013.01); *H01L 25/167* (2013.01); *H01L 33/52* (2013.01); *H01L 2224/48091* (2013.01); *H01L 2224/48137* (2013.01)

(58) Field of Classification Search
CPC ....................................................... H01L 33/54
USPC ............. 362/311.02, 311.06, 296.05; 438/28
See application file for complete search history.

(56) References Cited

U.S. PATENT DOCUMENTS

| 34,861 A | 4/1862 | Knowlton et al. |
|---|---|---|
| 4,855,194 A | 8/1989 | Wright |
| 4,946,547 A | 8/1990 | Palmour |
| 5,200,022 A | 4/1993 | Kong |
| 5,210,051 A | 5/1993 | Carter, Jr. |
| RE34,861 E | 2/1995 | Davis et al. |
| 5,393,993 A | 2/1995 | Edmond et al. |
| 5,523,589 A | 6/1996 | Edmond et al. |
| 6,093,053 A | 7/2000 | Horioka et al. |
| 6,224,430 B1 | 5/2001 | Kusuda et al. |
| 6,503,780 B1 | 1/2003 | Glenn et al. |
| 6,548,832 B1 | 4/2003 | Sakamoto et al. |
| 6,909,051 B2 | 6/2005 | Noble |
| 7,034,778 B1 | 4/2006 | Hähl |
| 7,055,987 B2 | 6/2006 | Staufert |
| D528,672 S | 9/2006 | Nagai |
| D528,996 S | 9/2006 | Egawa |

(Continued)

FOREIGN PATENT DOCUMENTS

| CN | 101438630 A | 5/2009 |
|---|---|---|
| CN | 101876406 | 11/2010 |

(Continued)

OTHER PUBLICATIONS

Online definition of the term "non-linear".*

(Continued)

*Primary Examiner* — Earl Taylor
(74) *Attorney, Agent, or Firm* — Jenkins, Wilson, Taylor & Hunt, P.A.

(57) ABSTRACT

Light emitting devices, systems, and methods are disclosed. In one embodiment a light emitting device can include an emission area having one or more light emitting diodes (LEDs) mounted over an irregularly shaped mounting area. The light emitting device can further include a retention material disposed about the emission area. The retention material can also be irregularly shaped, and can be dispensed. Light emitting device can include more than one emission area per device.

54 Claims, 10 Drawing Sheets

(56) References Cited

U.S. PATENT DOCUMENTS

| | | | |
|---|---|---|---|
| 7,208,838 B2 | 4/2007 | Masuda | |
| D541,761 S | 5/2007 | Saito et al. | |
| 7,224,000 B2 | 5/2007 | Aanegola et al. | |
| D570,506 S | 6/2008 | Uemoto | |
| D570,797 S | 6/2008 | Song | |
| D573,553 S | 7/2008 | Uemoto et al. | |
| D573,731 S | 7/2008 | Uemoto | |
| 7,393,237 B2 | 7/2008 | Kuo | |
| D576,576 S | 9/2008 | Shida et al. | |
| 7,479,660 B2 | 1/2009 | Kobilke | |
| 7,482,636 B2 | 1/2009 | Murayama et al. | |
| D586,303 S | 2/2009 | Fuwa et al. | |
| D589,470 S | 3/2009 | Chen | |
| D591,248 S | 4/2009 | Imai et al. | |
| D592,615 S | 5/2009 | Imai et al. | |
| D593,043 S | 5/2009 | Song | |
| D602,451 S | 10/2009 | Gielen | |
| D603,813 S | 11/2009 | Nishimura et al. | |
| D607,420 S | 1/2010 | Imai et al. | |
| 7,649,209 B2 | 1/2010 | Hussell et al. | |
| 7,655,957 B2 | 2/2010 | Loh et al. | |
| D615,051 S | 5/2010 | Chen et al. | |
| D615,052 S | 5/2010 | Imai et al. | |
| D618,635 S | 6/2010 | Imai et al. | |
| D622,876 S | 8/2010 | Takahashi et al. | |
| 7,780,313 B2 | 8/2010 | Lam et al. | |
| 7,804,147 B2 * | 9/2010 | Tarsa et al. | 257/433 |
| 7,812,365 B2 | 10/2010 | Murayama | |
| 7,825,578 B2 | 11/2010 | Takashima et al. | |
| D630,171 S | 1/2011 | Hsieh | |
| 7,872,418 B2 | 1/2011 | Hata et al. | |
| D636,899 S | 4/2011 | Shibahara | |
| D637,564 S | 5/2011 | Tseng et al. | |
| 7,943,952 B2 * | 5/2011 | Loh et al. | 257/100 |
| 7,955,147 B1 | 6/2011 | Legrady et al. | |
| D640,997 S | 7/2011 | Imai et al. | |
| 7,994,518 B2 | 8/2011 | Wang et al. | |
| D645,417 S | 9/2011 | Imai et al. | |
| 8,022,626 B2 | 9/2011 | Hamby et al. | |
| 8,044,418 B2 | 10/2011 | Loh et al. | |
| 8,058,088 B2 | 11/2011 | Cannon | |
| D650,760 S | 12/2011 | Hussell et al. | |
| 8,119,534 B2 | 2/2012 | Tanaka et al. | |
| D658,601 S | 5/2012 | Egawa et al. | |
| D658,602 S | 5/2012 | Egawa et al. | |
| D658,603 S | 5/2012 | Egawa et al. | |
| D667,803 S | 9/2012 | Hussell et al. | |
| D669,041 S | 10/2012 | Imai et al. | |
| 8,354,684 B2 | 1/2013 | West | |
| D676,000 S | 2/2013 | Hussell et al. | |
| D676,395 S | 2/2013 | Hussell et al. | |
| D683,708 S | 6/2013 | Sasano et al. | |
| 8,455,908 B2 | 6/2013 | Welch et al. | |
| 8,461,613 B2 | 6/2013 | Chou et al. | |
| 8,517,572 B2 * | 8/2013 | Ferenc | 362/326 |
| D689,451 S | 9/2013 | Shimonishi et al. | |
| 8,564,000 B2 | 10/2013 | Hussell | |
| 8,575,639 B2 | 11/2013 | Hussell | |
| 8,624,271 B2 | 1/2014 | Reiherzer | |
| D702,653 S | 4/2014 | Wilcox et al. | |
| D705,181 S | 5/2014 | Hussell et al. | |
| 8,729,589 B2 | 5/2014 | Hussell et al. | |
| 8,809,880 B2 | 8/2014 | Hussell | |
| D712,850 S | 9/2014 | Welch et al. | |
| 8,921,869 B2 | 12/2014 | Welch et al. | |
| D721,339 S | 1/2015 | Hussell et al. | |
| 8,994,057 B2 | 3/2015 | Hussell | |
| 9,000,470 B2 | 4/2015 | Tudorica | |
| 9,194,567 B2 | 11/2015 | Hussell et al. | |
| 9,203,004 B2 | 12/2015 | Hussell et al. | |
| 9,209,354 B2 | 12/2015 | Hussell et al. | |
| 2004/0079957 A1 | 4/2004 | Andrews et al. | |
| 2004/0169466 A1 | 9/2004 | Suehiro et al. | |
| 2004/0196663 A1 | 10/2004 | Ishida et al. | |
| 2005/0073244 A1 | 4/2005 | Chou et al. | |
| 2005/0152145 A1 | 7/2005 | Currie et al. | |
| 2005/0199899 A1 | 9/2005 | Lin et al. | |
| 2005/0264172 A1 | 12/2005 | Wojnarowski et al. | |
| 2006/0139595 A1 | 6/2006 | Koenen et al. | |
| 2006/0147746 A1 | 7/2006 | Wakako et al. | |
| 2006/0180818 A1 | 8/2006 | Nagai et al. | |
| 2006/0186418 A1 | 8/2006 | Edmond | |
| 2007/0018295 A1 | 1/2007 | Kim et al. | |
| 2007/0029569 A1 | 2/2007 | Andrews | |
| 2007/0057364 A1 | 3/2007 | Wang et al. | |
| 2007/0131954 A1 | 6/2007 | Murayama et al. | |
| 2007/0158668 A1 | 7/2007 | Tarsa | |
| 2007/0194336 A1 | 8/2007 | Shin et al. | |
| 2007/0247855 A1 | 10/2007 | Yano | |
| 2007/0252523 A1 | 11/2007 | Maeda et al. | |
| 2007/0253209 A1 | 11/2007 | Loh et al. | |
| 2008/0019130 A1 | 1/2008 | Wang | |
| 2008/0026498 A1 * | 1/2008 | Tarsa et al. | 438/26 |
| 2008/0054279 A1 | 3/2008 | Hussell et al. | |
| 2008/0054284 A1 | 3/2008 | Hussell et al. | |
| 2008/0054286 A1 | 3/2008 | Loh et al. | |
| 2008/0078664 A1 | 4/2008 | Schmidt et al. | |
| 2008/0079017 A1 * | 4/2008 | Loh et al. | 257/98 |
| 2008/0089072 A1 | 4/2008 | Kim et al. | |
| 2008/0106723 A1 | 5/2008 | Hoogendam et al. | |
| 2008/0153344 A1 | 6/2008 | Horst et al. | |
| 2008/0164484 A1 | 7/2008 | Lee | |
| 2008/0173884 A1 | 7/2008 | Chitnis | |
| 2008/0179611 A1 | 7/2008 | Chitnis | |
| 2008/0219003 A1 | 9/2008 | Park | |
| 2008/0224166 A1 | 9/2008 | Glovatsky et al. | |
| 2008/0239318 A1 | 10/2008 | Den Boef et al. | |
| 2008/0258130 A1 | 10/2008 | Bergmann | |
| 2009/0009103 A1 | 1/2009 | McKechnie et al. | |
| 2009/0023323 A1 | 1/2009 | Lin et al. | |
| 2009/0122514 A1 | 5/2009 | Yoon et al. | |
| 2009/0130889 A1 | 5/2009 | Daily et al. | |
| 2009/0166657 A1 * | 7/2009 | Yamada et al. | 257/98 |
| 2009/0239409 A1 | 9/2009 | Bishop | |
| 2009/0261374 A1 | 10/2009 | Hayashi | |
| 2009/0262527 A1 | 10/2009 | Chou | |
| 2009/0289169 A1 | 11/2009 | Yang et al. | |
| 2009/0315061 A1 | 12/2009 | Andrews | |
| 2010/0078664 A1 | 4/2010 | Helbing | |
| 2010/0096642 A1 | 4/2010 | Chang et al. | |
| 2010/0103660 A1 | 4/2010 | Van de Ven et al. | |
| 2010/0139836 A1 | 6/2010 | Horikoshi | |
| 2010/0141182 A1 | 6/2010 | Shi | |
| 2010/0155763 A1 | 6/2010 | Donofrio | |
| 2010/0193822 A1 | 8/2010 | Inobe et al. | |
| 2010/0252851 A1 | 10/2010 | Emerson et al. | |
| 2010/0253248 A1 | 10/2010 | Shi | |
| 2010/0264799 A1 | 10/2010 | Liu et al. | |
| 2010/0270567 A1 | 10/2010 | Emerson et al. | |
| 2010/0320483 A1 | 12/2010 | Kadotani et al. | |
| 2011/0012143 A1 | 1/2011 | Yuan et al. | |
| 2011/0013400 A1 | 1/2011 | Kanno et al. | |
| 2011/0019420 A1 * | 1/2011 | Kadotani et al. | F21K 9/135 362/249.03 |
| 2011/0043137 A1 | 2/2011 | Negley et al. | |
| 2011/0065241 A1 | 3/2011 | Lin et al. | |
| 2011/0068674 A1 | 3/2011 | Takenaka et al. | |
| 2011/0116275 A1 | 5/2011 | Sheek | |
| 2011/0121323 A1 | 5/2011 | Wu et al. | |
| 2011/0127912 A1 | 6/2011 | Lee et al. | |
| 2011/0128730 A1 | 6/2011 | Chiu | |
| 2011/0136394 A1 | 6/2011 | Mostoller et al. | |
| 2011/0148327 A1 | 6/2011 | Van de Ven et al. | |
| 2011/0176316 A1 | 7/2011 | Phipps et al. | |
| 2011/0221330 A1 | 9/2011 | Negley et al. | |
| 2011/0291151 A1 * | 12/2011 | Matsuda et al. | 257/99 |
| 2012/0126255 A1 * | 5/2012 | Hussell et al. | 257/88 |
| 2012/0126257 A1 | 5/2012 | Reiherzer et al. | |
| 2012/0175643 A1 | 7/2012 | West | |
| 2012/0193651 A1 * | 8/2012 | Edmond et al. | 257/88 |
| 2012/0205689 A1 | 8/2012 | Welch | |
| 2012/0241807 A1 | 9/2012 | Hoetzl et al. | |
| 2012/0250310 A1 | 10/2012 | Hussell et al. | |
| 2012/0299022 A1 | 11/2012 | Hussell | |

(56) References Cited

U.S. PATENT DOCUMENTS

| | | |
|---|---|---|
| 2013/0058099 A1 | 3/2013 | Shum et al. |
| 2013/0270592 A1 | 10/2013 | Hussell et al. |
| 2014/0097453 A1 | 4/2014 | Hussell et al. |
| 2014/0097454 A1 | 4/2014 | Hussell |
| 2014/0217433 A1 | 8/2014 | Tudorica et al. |
| 2014/0240974 A1 | 8/2014 | Hussell et al. |

FOREIGN PATENT DOCUMENTS

| | | |
|---|---|---|
| CN | 102044602 | 5/2011 |
| CN | ZL 2011-30139847.5 | 8/2012 |
| CN | ZL 2011-30166527.9 | 8/2012 |
| CN | ZL201230099913.5 | 11/2012 |
| CN | ZL201230099954.4 | 12/2012 |
| CN | ZL201230099981.1 | 12/2012 |
| CN | ZL 201230472866.4 | 5/2013 |
| CN | ZL201230130915.6 | 10/2013 |
| CN | ZL 201230652790.3 | 10/2013 |
| CN | ZL201230652789.0 | 11/2013 |
| CN | ZL201230652840.8 | 11/2013 |
| CN | ZL201330361367.2 | 1/2014 |
| EP | 1640792 | 3/2006 |
| EP | 1 670 073 | 6/2006 |
| EP | 2 302 283 | 3/2011 |
| EP | 2 302 286 | 3/2011 |
| EP | 2327930 | 6/2011 |
| EP | 2 560 219 A1 | 2/2013 |
| EP | 2 643 861 | 10/2013 |
| EP | 2 643 862 | 10/2013 |
| FR | 2 921 537 | 9/2007 |
| JP | 07-038940 | 9/1995 |
| JP | 10-311937 | 11/1998 |
| JP | 2001-294083 | 10/2001 |
| JP | 2003-192442 | 7/2003 |
| JP | 2003-303504 | 10/2003 |
| JP | 2004-228413 | 8/2004 |
| JP | 2004-311948 A | 11/2004 |
| JP | 2005-183148 | 7/2005 |
| JP | 2005-266117 | 9/2005 |
| JP | 2005-276979 | 10/2005 |
| JP | 2006/066786 | 3/2006 |
| JP | 2006-294898 | 10/2006 |
| JP | 2007-227680 | 9/2007 |
| JP | 2007-266357 | 10/2007 |
| JP | 2007-323857 | 12/2007 |
| JP | 2007-335371 | 12/2007 |
| JP | 2008-244075 | 10/2008 |
| JP | 2009-503888 | 1/2009 |
| JP | 2009-044055 | 2/2009 |
| JP | 2009-289918 | 12/2009 |
| JP | 2010-009972 | 1/2010 |
| JP | 2010103541 | 5/2010 |
| JP | 2010-147189 | 7/2010 |
| JP | 2010192109 A | 9/2010 |
| JP | 2011-108744 | 6/2011 |
| JP | 2011-228369 | 11/2011 |
| JP | 2012-503331 | 2/2012 |
| JP | 2012-079855 | 4/2012 |
| JP | 1461828 | 2/2013 |
| JP | 1476166 | 7/2013 |
| JP | 1476175 | 7/2013 |
| JP | 1493219 | 2/2014 |
| KR | 3004423910000 | 3/2007 |
| KR | 10-0793338 | 1/2008 |
| KR | 10-2008-0092239 | 10/2008 |
| KR | 10-2009-0011121 | 3/2009 |
| KR | 10-2010-0111255 | 10/2010 |
| KR | 10-2011-0004632 | 1/2011 |
| KR | 10-2011-0021639 | 3/2011 |
| KR | DES 30-0753131 | 7/2014 |
| KR | DES 30-0753132 | 7/2014 |
| TW | 540169 | 7/2003 |
| TW | 113260 | 10/2006 |
| TW | 124444 | 8/2008 |
| TW | D125589 | 10/2008 |
| TW | 128526 | 5/2009 |
| TW | 201029146 | 8/2010 |
| TW | D141645 | 7/2011 |
| TW | D144159 | 12/2011 |
| TW | D145644 | 3/2012 |
| TW | D156539 | 10/2013 |
| TW | D159325 | 3/2014 |
| TW | D159849 | 4/2014 |
| TW | D159850 | 4/2014 |
| TW | D159851 | 4/2014 |
| TW | I502772 KR | 10/2015 |
| WO | WO 2008/069204 | 6/2008 |
| WO | WO 2009/133615 | 11/2009 |
| WO | WO 2009/141982 | 11/2009 |
| WO | WO 2011/129203 | 10/2011 |
| WO | WO 2012/029360 | 3/2012 |
| WO | WO 2012/071136 | 5/2012 |
| WO | WO 2012/071138 | 5/2012 |
| WO | WO 2012/071139 | 5/2012 |
| WO | WO 2013/032737 | 3/2013 |
| WO | WO 2013/070696 | 5/2013 |
| WO | WO 2013/096431 | 6/2013 |
| WO | WO 2013/122831 | 8/2013 |

OTHER PUBLICATIONS

Patent Application for U.S. Appl. No. 13/336,540, filed Dec. 23, 2011.
International Search Report and Written Opinion for Application Serial No. PCT/US2011/058596 dated Jun. 18, 2012.
Chinese Office Action for Application Serial No. CN 2012/30130915.6 dated Jul. 12, 2012.
Office Action/Restriction Requirement for U.S. Appl. No. 13/028,972 dated Jul. 25,2012.
Notification of Grant for Chinese Patent Application No. 2012/30099913.5 dated Aug. 7, 2012.
Notification of Grant for Chinese Patent Application No. 2012/30099981.1 dated Aug. 17, 2012.
Notification of Grant for Chinese Patent Application No. 2012/30099954.4 dated Aug. 17, 2012.
Notice of Allowance for U.S. Appl. No. 29/407,084 dated Aug. 21, 2012.
Notice of Allowance for U.S. Appl. No. 29/380,387 dated Sep. 18, 2012.
Notice of Allowance for U.S. Appl. No. 29/408,955 dated Oct. 4, 2012.
Non-Final Office Action for U.S. Appl. No. 13/028,972 dated Oct. 10, 2012.
Chinese Office Action for Application No. CN 2012/30130915.6 dated Oct. 24, 2012.
Chinese Office Action for Application No. 201230472866.4 dated Nov. 14, 2012.
Non-Final Office Action for U.S. Appl. No. 13/104,558 dated Jan. 3, 2013.
Bridgelux Product Data Sheet—1 page.
Citizen Co. Product Data Sheet—4 pages http://ce.citizen.co.jp/lighting_led/en/products/index.html.
U.S. Appl. No. 29/379,636 for "Light Emitting Device Package".
Design U.S. Appl. No. 29/380,387 for "Light Emitting Device Package" filed Dec. 3, 2010.
U.S. Appl. No. 13/028,972 for "Light Emitting Devices and Methods" filed Feb. 16, 2011.
U.S. Appl. No. 13/104,558 for "Light Emitting Devices and Methods" filed May 10, 2011.
Notice of Allowance for U.S. Appl. No. 29/379,636 dated Aug. 4, 2011.
Design U.S. Appl. No. 29/404,913 for "Light Emitting Device Component" filed Oct. 26, 2011.
Design U.S. Appl. No. 29/379,636 for "Light Emitting Device Package" filed Nov. 22, 2011.
Design U.S. Appl. No. 29/408,955 for "Light Emitting Device Package" filed Dec. 19, 2011.
Notification of Granting Patent Right for Design for Application Serial No. CN 2011/30166527.9 dated Apr. 6, 2012.
Non-Final Office Action for U.S. Appl. No. 29/380,387 dated Apr. 25, 2012.
Notification of Granting Patent Right for Design for Application Serial No. CN 2011/30139847.5 dated Apr. 26, 2012.

(56) References Cited

OTHER PUBLICATIONS

Notice of Allowance for U.S. Appl. No. 29/408,955 dated May 7, 2012.
Notice of Allowance for U.S. Appl. No. 29/407,084 dated May 18, 2012.
International Search Report and Written Opinion for Application Serial No. PCT/US2011/058603 dated May 23, 2012.
International Search Report and Written Opinion for Application Serial No. PCT/US2011/058601 dated May 24, 2012.
Taiwanese Search Report for Application No. 101302309 dated Jan. 14, 2013.
Taiwanese Office Action for Application No. 101302309 dated Jan. 23, 2013.
Chinese Decision to Grant for Application No. 201230472866.4 dated Jan. 24, 2013.
Notice of Allowance for U.S. Appl. No. 13/336,540 dated Jan. 31, 2013.
Restriction Requirement for U.S. Appl. No. 13/671,089, filed Feb. 7, 2013.
Restriction Requirement for U.S. Appl. No. 29/404,913, filed Feb. 15, 2013.
Japanese Office Action for Application No. 2012-023963 dated Feb. 26, 2013.
Japanese Office Action for Application No. 2012-026117 dated Feb. 26, 2013.
Chinese Office Action for Application No. CN 2012/30130915.6 dated Feb. 27, 2013.
Notice of Allowance for U.S. Appl. No. 13/028,972 dated Feb. 28, 2013.
International Search Report and Written Opinion for Application No. PCT/US2012/051344 dated Feb. 28, 2013.
International Search Report and Written Opinion for Application No. PCT/US2012/063861 dated Mar. 18, 2013.
Non-Final Office Action for U.S. Appl. No. 13/671,089 dated Mar. 29, 2013.
International Search Report and Written Opinion for Application No. PCT/US2012/070589 dated Apr. 22, 2013.
International Search Report and Written Opinion for Application No. PCT/US2013/025307 dated May 15, 2013.
Japanese Decision of Registration for Application No. 2012-023963 dated Jun. 4, 2013.
Japanese Decision of Registration for Application No. 2012-026117 dated Jun. 4, 2013.
Notice of Allowance for U.S. Appl. No. 13/028,972 dated May 23, 2013.
Japanese Office Action for Application No. 2012-031549 dated May 31, 2013.
Taiwanese Notice of Allowance for Application No. 101302309 dated Jun. 5, 2013.
Notice of Allowance for U.S. Appl. No. 13/435,912 dated Jun. 19, 2013.
Notice of Allowance for U.S. Appl. No. 29/404,913 dated Jun. 25, 2013.
Chinese Notice of Grant for Application No. 201230652790.3 dated Jun. 26, 2013.
Notice of Allowance for U.S. Appl. No. 13/104,558 dated Jul. 1, 2013.
Chinese Notice of Grant for Application No. 201230130915.6 dated Jul. 3, 2013.
Chinese Decision to Grant for Application No. 201230652789 dated Jul. 17, 2013.
Taiwanese Search Report for Application No. 102301394 dated Jul. 9, 2013.
Taiwanese Office Action for Application No. 102301394 dated Jul. 15, 2013.
Chinese Notice of Grant for Application No. 201230652840.3 dated Jul. 26, 2013.
Ex Parte Quayle Action for U.S. Appl. No. 13/671,089 dated Aug. 13, 2013.
Korean Office Action for Application No. 30-2012-0020196 dated Aug. 13, 2013.
Korean Office Action for Application No. 30-2012-0020197 dated Aug. 13, 2013.
Korean Office Action for Application No. 30-2012-0020198 dated Aug. 13, 2013.
Notice of Allowance for U.S. Appl. No. 13/104,558 dated Aug. 28, 2013.
Japanese Office Action for Application No. 2012-031548 dated Nov. 5, 2013.
Japanese Office Action for Application No. 2012-031549 dated Nov. 5, 2013.
Taiwanese Notice of Allowance for Application No. 102301394 dated Nov. 8, 2013.
Taiwanese Notice of Allowance for Application No. 102301395 dated Nov. 8, 2013.
Non-Final Office Action for U.S. Appl. No. 13/793,882 dated Nov. 15, 2013.
Restriction Requirement for U.S. Appl. No. 13/282,172, dated Nov. 26, 2013.
Notice of Allowance for U.S. Appl. No. 29/404,913 dated Nov. 27, 2013.
Taiwanese Notice of Allowance for Application No. 102301583 dated Dec. 17, 2013.
Taiwanese Notice of Allowance for Application No. 102301581 dated Dec. 17, 2013.
Taiwanese Notice of Allowance for Application No. 102301585 dated Dec. 17, 2013.
Notice of Allowance for U.S. Appl. No. 29/412,168 dated Dec. 20, 2013.
Non-Final Office Action for U.S. Appl. No. 29/425,831 dated Dec. 24, 2013.
Notice of Allowance for U.S. Appl. No. 29/412,166 dated Dec. 24, 2013.
Non-Final Office Action for U.S. Appl. No. 29/451,177 dated Dec. 30, 2013.
Notice of Allowance for U.S. Appl. No. 29/417,220 dated Jan. 10, 2014.
Taiwanese Notice of Allowance for Application No. 102301582 dated Jan. 13, 2014.
Taiwanese Notice of Allowance for Application No. 102301584 dated Jan. 13, 2014.
Japanese Decision of Registration for Application No. 2013-018279 dated Jan. 15, 2014.
Taiwanese Notice of Allowance for Application No. 102300058 dated Jan. 17, 2014.
Taiwanese Notice of Allowance for Application No. 102300059 dated Jan. 17, 2014.
Korean Notice of Rejection for Application No. KR 30-2012-0020198 dated Jan. 14, 2014.
Taiwanese Notice of Allowance for Application No. 101307667 dated Feb. 7, 2014.
Supplemental Notice of Allowance for U.S. Appl. No. 29/404,913 dated Feb. 20, 2014.
Notice of Allowance for U.S. Appl. No. 13/793,882 dated Mar. 12, 2014.
Restriction Requirement for U.S. Appl. No. 14/043,494 dated Mar. 20, 2014.
Restriction Requirement for U.S. Appl. No. 13/908,597 dated Mar. 20, 2014.
Restriction Requirement for U.S. Appl. No. 14/052,201 dated Mar. 20, 2014.
Non-Final Office Action for U.S. Appl. No. 13/282,172 dated Mar. 21, 2014.
Taiwanese Search Report for Application No. 102300059 dated Apr. 17, 2013.
Taiwanese Search Report for Application No. 102300058 dated Apr. 29, 2013.
Taiwanese Search Report for Application No. 102301395 dated Jul. 9, 2013.
Taiwanese Office Action for Application No. 102301395 dated Jul. 15, 2013.

(56) References Cited

OTHER PUBLICATIONS

Taiwanese Office Action for Application No. 102300058 dated Aug. 27, 2013.
Taiwanese Office Action for Application No. 102301581 dated Sep. 6, 2013.
Taiwanese Office Action for Application No. 102301582 dated Sep. 6, 2013.
Taiwanese Office Action for Application No. 102301583 dated Sep. 6, 2013.
Taiwanese Office Action for Application No. 102301584 dated Sep. 6, 2013.
Taiwanese Office Action for Application No. 102301585 dated Sep. 6, 2013.
Restriction Requirement for Application No. 13/793,882 dated Sep. 20, 2013.
Restriction Requirement for U.S. Appl. No. 29/417,220 dated Sep. 27, 2013.
Restriction Requirement for U.S. Appl. No. 29/451,177 dated Sep. 27, 2013.
Restriction Requirement for U.S. Appl. No. 29/425,831 dated Sep. 30, 2013.
Taiwanese Office Action for Application No. 102300059 dated Oct. 1, 2013.
Chinese Notice to Grant for Application No. 201330361367.2 dated Oct. 8, 2013.
Notice of Allowance for U.S. Appl. No. 13/671,089 dated Oct. 22, 2013.
Restriction Requirement for U.S. Appl. No. 29/412,166 dated Oct. 25, 2013.
Restriction Requirement for U.S. Appl. No. 29/412,168 dated Oct. 25, 2013.
Restriction Requirement for U.S. Appl. No. 13/836,709 dated Jun. 19, 2014.
Non-Final Office Action for U.S. Appl. No. 14/189,500 dated Jul. 15, 2014.
Taiwanese Office Action for Application No. 100141889 dated Aug. 6, 2014.
Notice of Allowance for U.S. Appl. No. 13/908,597 dated Aug. 20, 2014.
European Patent Office Communication pursuant to Rule 114(2) EPC for Application No. 2011-0843773 dated Aug. 20, 2014.
Notice of Allowance for U.S. Appl. No. 29/425,831 dated Sep. 4, 2014.
Final Office Action for U.S. Appl. No. 13/282,172 dated Sep. 17, 2014.
Taiwanese Office Action for Application No. 100141888 dated Mar. 11, 2014.
Notice of Allowance for U.S. Appl. No. 29/451,177 dated Apr. 25, 2014.
Restriction Requirement for U.S. Appl. No. 14/148,102 dated Apr. 24, 2014.
Notice of Allowance for U.S. Appl. No. 29/487,954 dated Mar. 30, 2015.
European Patent Office Communication pursuant to Rule 114(2) EPC for Application No. 20110843026 dated Sep. 24, 2014.
Taiwanese Office Action for Application No. 100141887 dated Sep. 11, 2014.
Korean Decision of Rejection for Application No. 10-2013-7015669 dated Nov. 6, 2014.
Taiwanese Notice of Allowance for Application No. 100141889 dated Dec. 8, 2014.
Korean Certificate of Design Patent for Application No. 2012-0020196 dated Jul. 14, 2014.
Korean Certificate of Design Patent for Application No. 2012-0020197 dated Jul. 14, 2014.
Non-Final Office Action for U.S. Appl. No. 14/148,102 dated Dec. 5, 2014.
Notice of Allowance for U.S. Appl. No. 14/043,494 dated Dec. 10, 2014.
Notice of Allowance for U.S. Appl. No. 14/052,201 dated Nov. 28, 2014.
Restriction Requirement for U.S. Appl. No. 29/452,692 dated Dec. 4, 2014.
Japanese Office Action for Application No. 2013-540955 dated Jan. 20, 2015.
Notice of Allowance for U.S. Appl. No. 14/189,500 dated Jan. 23, 2015.
Korean Decision to Decline Amendment and Decision of Rejection for Application No. 10-2013-7015669 dated Dec. 26, 2014.
Notice of Allowance for U.S. Appl. No. 14/168,561 dated Nov. 28, 2014.
Restriction Requirement for U.S. Appl. No. 29/459,233 dated Feb. 23, 2015.
Restriction Requirement for U.S. Appl. No. 29/459,231 dated Feb. 13, 2015.
Notice of Allowance for U.S. Appl. No. 13/282,172 dated Nov. 16, 2015.
Notice of Issuance for Chinese Application No. 201280066174.7 dated Dec. 11, 2015.
Japanese Office Action for Application No. 2013-540955 dated Dec. 15, 2015.
Notice of Allowance for U.S. Appl. No. 13/282,172 dated Dec. 23, 2015.
Advisory Action for U.S. Appl. No. 13/800,284 dated Jan. 4, 2016.
Notice of Allowance for U.S. Appl. No. 14/043,494 dated Apr. 17, 2015.
European Search Report for Application No. 11 84 3026 dated Apr. 17, 2015.
Notice of Allowance for U.S. Appl. No. 14/148,102 dated Apr. 22, 2015.
Supplementary European Search Report for Application No. 11 84 3026 dated Apr. 28, 2015.
Non-Final Office Action for U.S. Appl. No. 13/282,172 dated May 11, 2015.
Notice of Allowance for U.S. Appl. No. 29/459,231 dated May 11, 2015.
Notice of Allowance for U.S. Appl. No. 14/189,500 dated May 14, 2015.
Notice of Allowance for U.S. Appl. No. 29/459,233 dated May 21, 2015.
Japanese Office Action for Application No. 2014-548830 dated May 19, 2015.
Supplemental Notice of Allowability for U.S. Appl. No. 14/043,494 dated May 28, 2015.
Japanese Office Action for Application No. 2012-031549 dated May 25, 2015.
Taiwanese Notice of Allowance for Application No. 100141887 dated May 28, 2015.
Non-Final Office Action for U.S. Appl. No. 13/800,284 dated Jun. 4, 2015.
Extended European Search Report for Application No. 12849022.4 dated Jun. 16, 2015.
Supplementary European Search Report for Application No. 12827778.7 dated Jun. 4, 2015.
Appeal Decision for Japanese Design Application No. 2012-031548 dated Jun. 17, 2015.
Non-Final Office Action for U.S. Appl. No. 14/673,263 dated Jun. 30, 2015.
Final Office Action for U.S. Appl. No. 13/296,812 dated Apr. 23, 2015.
Japanese Office Action for Application No. 2013/540955 dated Jul. 7, 2015.
Chinese Office Action for Application No. 201280066174.7 dated Jun. 3, 2015.
Korean Office Action for Application No. 10-2014-7014959 dated Nov. 9, 2015.
Japanese Office Action for Application No. dated Nov. 10, 2015.

* cited by examiner

LIGHT EMITTING DEVICES, SYSTEMS, AND METHODS

TECHNICAL FIELD

The subject matter disclosed herein relates generally to light emitting devices, systems, and methods. More particularly, the subject matter disclosed herein relates to light emitting devices, systems, and methods comprising one or more irregularly shaped LED mounting areas for increasing the utilization of area available to produce light emission dimensionally restricted devices.

BACKGROUND

Light emitting devices, such as light emitting diodes (LEDs), are currently used in many different general lighting applications and systems, for example, in products targeting replacement of incandescent, fluorescent, and metal halide high-intensity discharge (HID) products. As the number of LED lighting applications increase, lighting device manufacturers and/or designers increasingly face tighter dimensional restrictions while being required to maintain or increase brightness and light output levels from the devices. For example, manufacturers may be required to produce a given light output from a device which has a restricted amount of LED mounting area available on the device. Conventional designs used in lighting devices may arrange LEDs in very regular and/or symmetrically shaped arrays, e.g. a square or circle. The regular or symmetrically shaped arrays are often positioned in the middle of the lighting device, and do not efficiently utilize all of the available space.

Accordingly, a need remains for increasing the utilization of the limited area available for mounting LEDs by providing LED mounting arrangements that can be irregular or asymmetrical in shape while promoting ease of manufacture.

SUMMARY

In accordance with this disclosure, novel light emitting devices, systems, and methods are provided that are well suited for a variety of applications, including industrial and commercial lighting products. It is, therefore, an object of the present disclosure herein to provide easy to manufacture light emitting devices, systems, and methods adapted to increase the utilization of LED mounting area available by providing LED mounting arrangements that are irregular or asymmetrical in shape.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
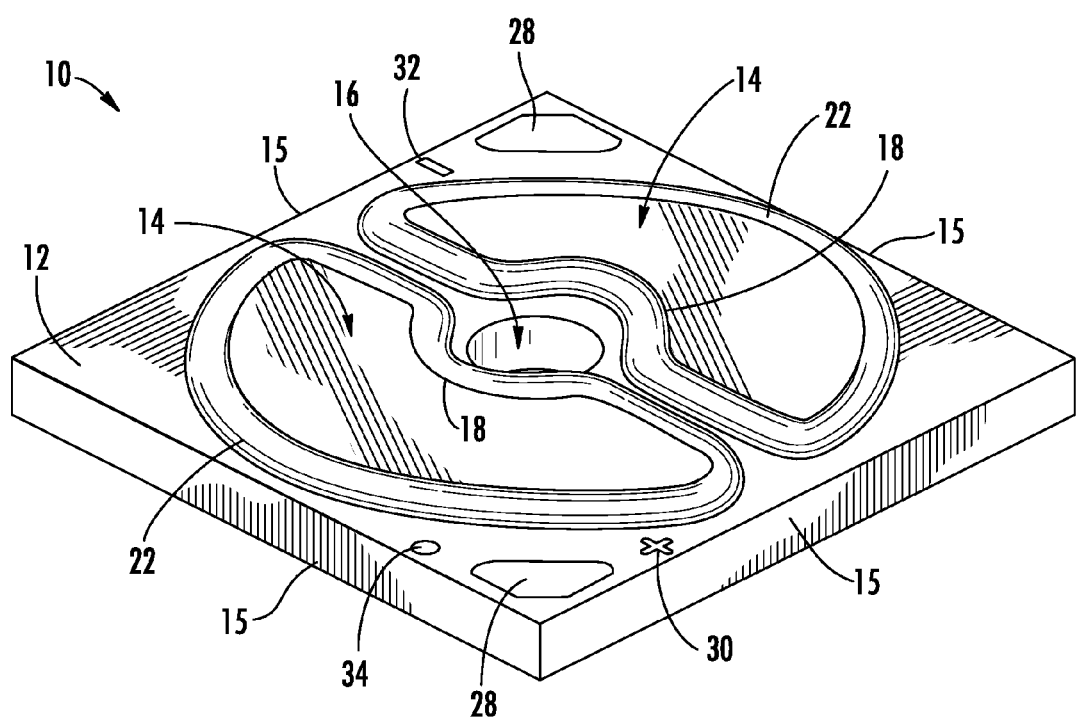
FIG. 1 is a perspective view of a light emitting diode (LED) device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise group III-V nitride (e.g., gallium nitride) based light emitting diodes (LEDs) or lasers fabricated on a growth substrate, for example, a silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein. For example, sapphire and gallium arsenide can be utilized as growth substrates for fabricating LEDs or lasers as described herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or substrate which may have different thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

As described further, one or more LEDS can be coated, at least partially, with one or more phosphors with the phosphors absorbing at least a portion of the LED light and emitting a different wavelength of light such that the LED emits a combination of light from the LED and the phosphor. In one embodiment, the LED emits a white light combination of LED and phosphor light. One or more LEDs can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LEDs are described in U.S. patent application Ser. No. 12/014,404 entitled "Phosphor Coating Systems and Methods for Light Emitting Structures and Packaged Light Emitting Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LEDs can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that LED devices, systems, and methods according to the present subject matter can also have multiple LEDs of different colors, one or more of which may be white emitting.

Figure 7A:
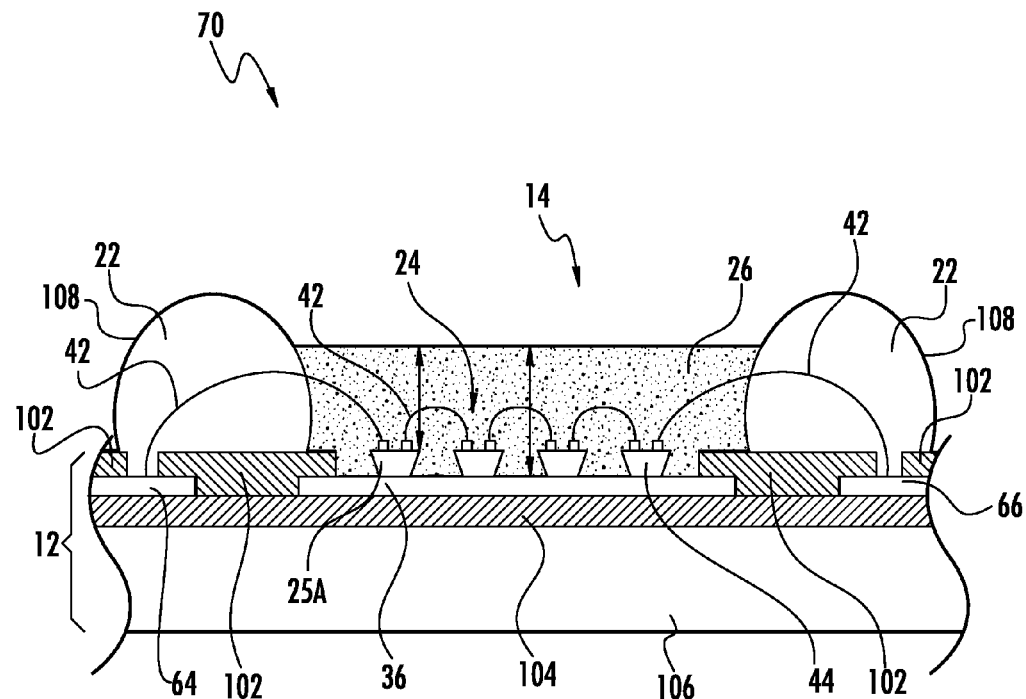
FIGS. 7A and 7B are cross-sectional views of an embodiment of an LED device according to the disclosure herein.
Figure 7B:
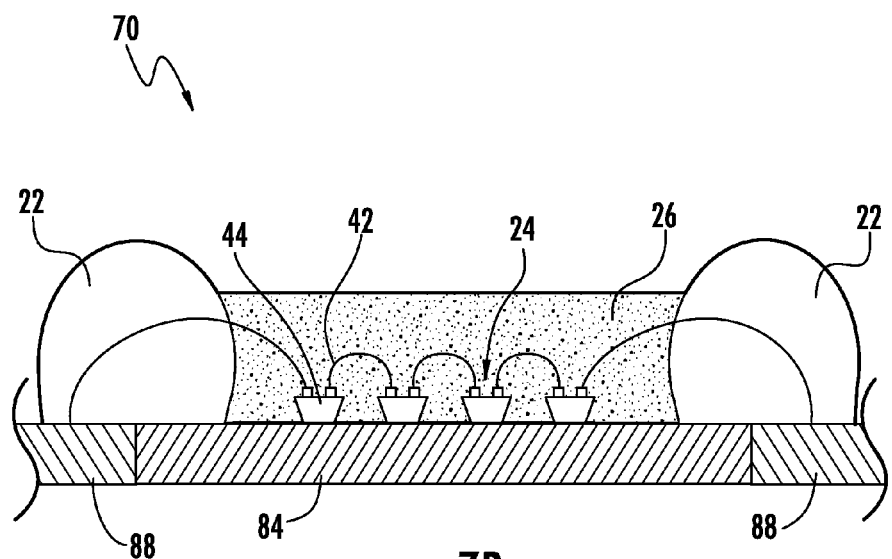
Figure 8:
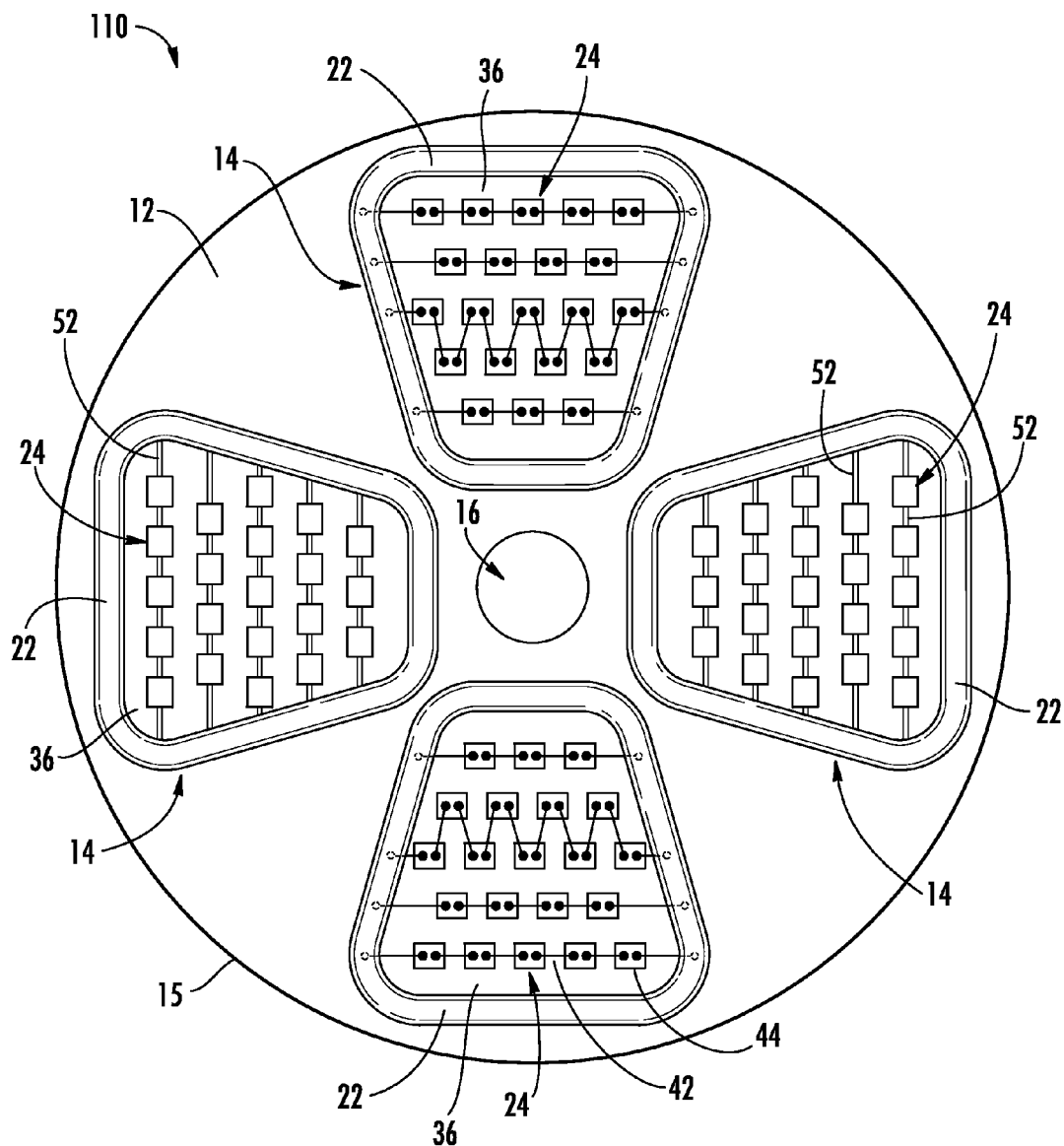
FIG. 8 is a top plan view of an embodiment of an LED device according to the disclosure herein.

Referring now to FIGS. 1 to 9, FIG. 1 is a top perspective view of a light emitting device or package, or LED device, generally designated 10. LED device 10 can comprise a submount 12 over which one or more emission areas, generally designated 14, can be disposed. In one aspect, emission area 14 can be disposed at any suitable location over LED device 10, for example, approximately a center location and/or an off-center location (FIG. 8). In one aspect, LED device 10 can comprise two or more emission areas 14 disposed about an attachment area, generally designated 16. Attachment area 16 can comprise an opening disposed through or at least partially through submount 12 for facilitating attachment of LED device 10 to an external submount or surface. For example, attachment area 16 can comprise an area for receiving screws, clips, pins, or other fasteners inserted through and/or attached to the at least one attachment area 16 for securing device 10 to another member, structure, substrate or submount. In another aspect, instead of comprising a hole or opening, attachment area 16 can comprise an actual attachment member such as a pin, clip, or other any other suitable fastener, for example, a spring clip.

Figure 10:
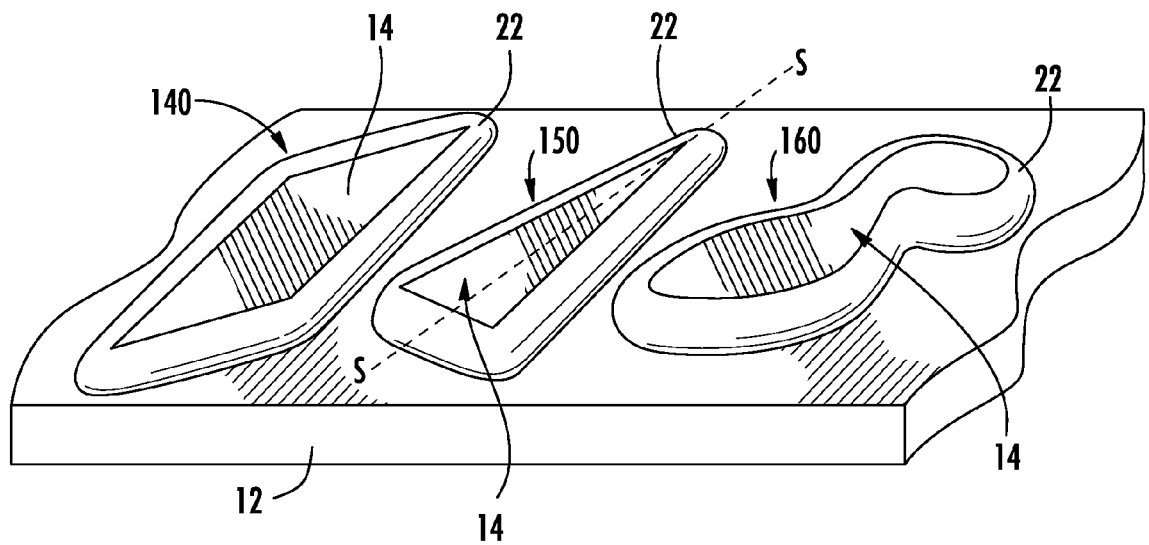
FIG. 10 is a perspective view of an embodiment of an LED device according to the disclosure herein.

Emission area 14 can have a substantially irregular shape. Irregular or asymmetrical shape in accordance with the disclosure herein is meant to be interpreted broadly and without limitation and can be any shape or configuration that is not considered regular or symmetrical. For example and without limitation, irregular can mean any shape that does not have all sides of an equal length or that does not have all angles equal. An irregular shape is not a regular shape such as, for example and without limitation, a square, circle, oval, equilateral triangle, regular pentagon, regular hexagon, regular octagon or any other regular shapes having all sides and all angles equal. Regular shapes can comprise many lines of symmetry as opposed to an irregular shape which generally does not have more than two lines of symmetry. Irregular shapes having more than two lines of symmetry are contemplated, however. A line of symmetry comprises an imaginary line where the image could be folded such that both halves match exactly (line S, FIGS. 6, 10). For example, a rectangle can be categorized as an irregular shape as it does not have all sides equal, and the rectangle has at most two lines of symmetry. In one aspect, irregular shapes can have no more than one line of symmetry. In one aspect, irregular shapes can have no or zero lines of symmetry as the shape is so irregular that it is asymmetric (FIG. 10). Even where a shape or configuration may have all sides the same length, such as with an equilateral polygon, the shape or configuration can still be irregular as the angles between segments can be different making it irregular.

In other aspects, irregular can be any irregular or asymmetrical shape or configuration regardless of lines of symmetry and regardless as to whether all sides and all angles equal. For example and without limitation, an irregular shape or configuration can be any shape or configuration lacking uniformity or symmetry, uneven in shape, position, or arrangement, and/or having at least some or all portions that do not occur or are not disposed at expected or equal intervals or positions. An irregular shape or configuration can in another aspect be a shape or configuration with one or more curved portions or without any curved portions. An irregular shape or configuration can be a shape or configuration with or without one or more protrusion areas that can bring irregularity to the shape or configuration. Irregular in accordance with this disclosure can also be a shape or configuration that includes an aspect ratio between portions that is skewed slightly or drastically such that the shape or configuration is no longer deemed regular. An irregular shape or configuration can also have some portions that may be regular or no portion that is regular.

Emission area 14 can comprise any suitable irregular and/or asymmetrical shape having one or more curved, convex, or concave portions 18. Notably, irregularly shaped emission area 14 can comprise irregularly shaped mounting areas (FIG. 4) over which one or more LEDs may become mounted. Thus, irregular shapes can advantageously utilize more area over which LEDs may become mounted. In one aspect, irregularly shaped emission area 14 can curve proximate and/or adjacent to attachment area 16 thereby eliminating the need for more than one attachment area. This can advantageously allow more space for emission area 14 to expand and occupy on LED device 10. Thus, as LED devices become dimensionally smaller, one or more irregularly shaped emission areas 14 comprising irregularly shaped mounting surfaces can efficiently utilize space by expanding via different sides and/or angles to curve and fit about other features of LED device, for example, attachment areas 16, to create more space from which LEDs may emit light. For example, emission area 14 can expand such that it is proximate one or more edges 15 of submount 12. Submount 12 can comprise more than one edge 15, depending on its shape. For example, submount 12 can comprise a square having four edges 15 of equal length. Or, submount 12 can comprise a circle having one edge 15, or circumference. Any submount 12 shape is contemplated. In other embodiments, a submount may not be necessary. (FIG. 7B)

Figure 4:
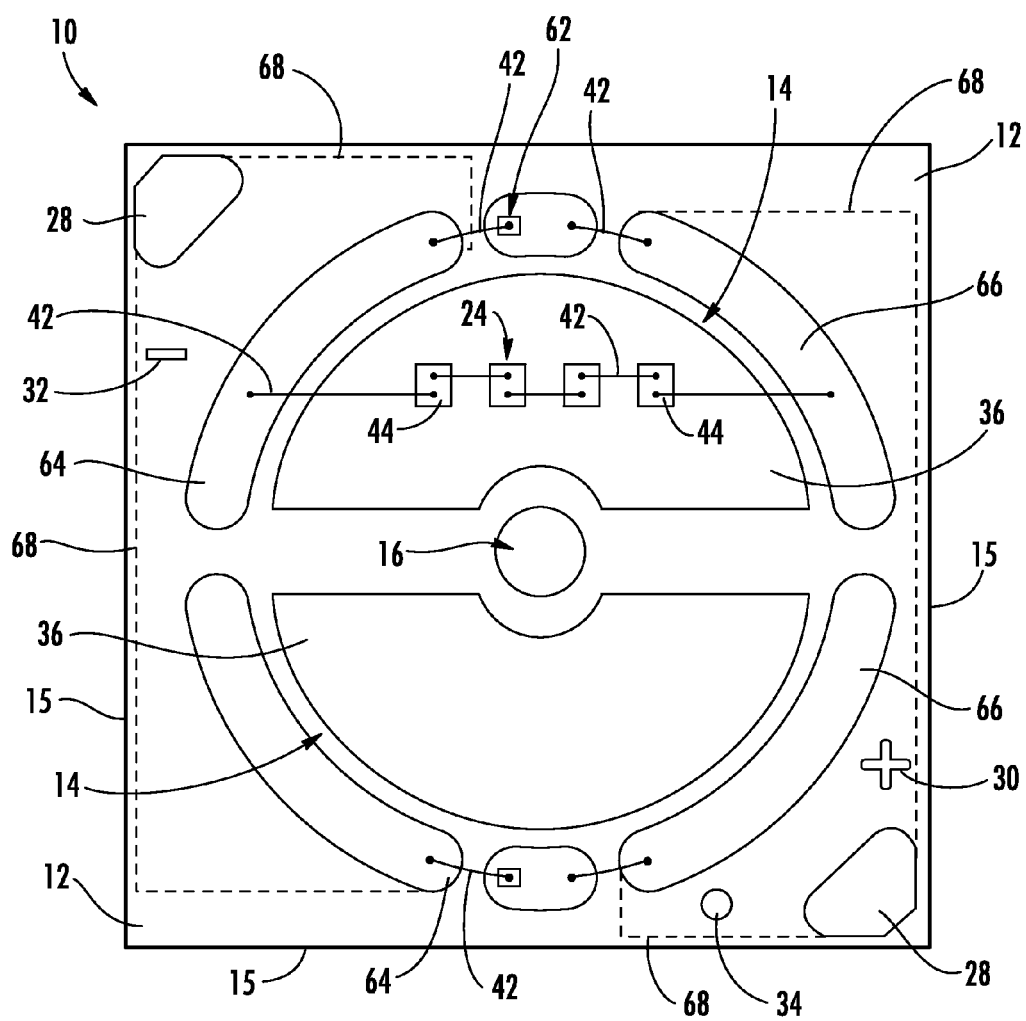
FIG. 4 is a schematic illustration of an embodiment LED device according to the disclosure herein.

LED device 10 can comprise a single emission area 14 or more than one emission area 14. Notably, each emission area 14 can comprise a uniform, undivided optical source that can have one or more LEDs disposed therein, which can simplify the manufacturing process for manufacturers of light products requiring a single component. Each emission area 14 can for example comprise a uniform, undivided mounting area for the one or more LEDs. LED device 10 can further comprise a retention material 22 disposed at least partially about emission area 14 where retention material 22 can be referred to as a dam. Retention material 22 can also be disposed over one or more electrostatic discharge (ESD) protection devices, such as a Zener diode 62 (FIG. 4). In some aspects, retention material can be disposed over two Zener diodes 62 connected in series between two electrical elements.

Submount 12 can comprise any suitable mounting substrate, for example, a printed circuit board (PCB), a metal core printed circuit board (MCPCB), an external circuit, or any other suitable submount over which lighting devices such as LEDs may mount and/or attach. In one aspect, submount 12 can comprise a composite submount comprising one or more LEDs mounted on a thermally conductive material and a separate attachment area 16 that is free of LEDs and the material on which they are mounted. Emission area 14 can be in electrical and/or thermal communication with submount 12. In one aspect, one or more intervening layers can be disposed between emission area 14 and submount 12 such that emission area 14 is indirectly disposed over submount 12 thereby indirectly electrically and/or thermally communicating with submount 12. In the alternative, emission area 14 can directly mount over submount 12 thereby directly electrically and/or thermally communicating, or connecting, with submount 12. In one aspect and for example only and without limitation, submount 12 can comprise a compact dimension of 22 millimeter (mm)×22-mm square footprint. In other aspects, submount 12 can comprise any suitable dimension and/or shape, for example, a circular or rectangular shape.

Emission area 14 can comprise a single LED or a plurality of LED chips, or LEDs, generally designated 24 disposed within and/or below a filling material 26 such as illustrated in FIGS. 7A and 7B. LEDs 24 can comprise a high density array of LEDs mounted on a thermally conductive material or mounting area 36. LEDs 24 can comprise any suitable size, shape, and/or chip structure. For example, LEDs 24 can comprise a rectangle, square, or any other suitable shape. LEDs 24 can comprise horizontal or vertical chip structures with or without bond pads. In one aspect, filling material 26 can comprise an encapsulant having a predetermined, or selective, amount of phosphors and/or lumiphors in an amount suitable for any desired light emission, for example, suitable for white light conversion. Filling material 26 can interact with light emitted from the plurality of LEDs 24 such that a perceived white light, or any suitable and/or desirable wavelength of light, can be observed. Any suitable combination of encapsulant and/or phosphors can be used, and combinations of different phosphors for resulting in desired light emission can be used. In other aspects, filling material 26 can comprise a molded lens material. Filling material 26 can be substantially opaque such that emission area 14 can be substantially opaque (as illustrated in FIG. 1), transparent, or semi-transparent depending upon, for example, the amount and type of phosphor used. Retention material 22 can be adapted for dispensing, or placing, about at least a portion of emission area 14. After placement of retention material 22, filling material 26 can be selectively filled to any suitable level within the space disposed between one or more inner walls of retention material 22. For example, filling material 26 can be filled to a level equal to the height of retention material 22 or to any level above or below retention material. The level of filling material 26 can be planar or curved in any suitable manner, such as concave or convex. In some aspects, the retention material or dam can be offset from an edge of the LED device or package. In other aspects, the retention material or dam can be aligned with an edge of the LED device or package.

LED device 10 can also comprise one or more electrical attachment surfaces 28 disposed outside of emission area 14. In one aspect, attachment surfaces 28 comprise electrical contacts such as solder contacts. Attachment surfaces 28 can be any suitable configuration, size, shape and/or location and can comprise positive and negative electrode terminals through which an electrical current or signal can pass when connected to an external power source. One or more conducting wires (not shown) can be attached and electrically connected to attachment surfaces 28 when welded, soldered, or any other suitable attachment method known. Electrical current or signal can pass into LED device 10 from the external wires electrically connected to the attachment surfaces 28 and into the emission area 14 to facilitate light output. Attachment surfaces 28 can electrically communicate with emission area 14 which can comprise one or more LEDs 24. Attachment surfaces 28 can electrically communicate with one or more electrically conductive traces as described further below (see FIG. 4) to which LEDs 24 may be electrically connected using electrical connectors. Electrical connectors can comprise wirebonds or other suitable members for electrically connecting LEDs 24 to one or more conductive traces.

LED device 10 can further comprise one or more indicator signs or symbols for denoting the electrical polarity for a given portion of LED device 10. For example, a first symbol 30 can comprise a "+" sign denoting the side of LED device 10 comprising the positive electrode terminal. A second symbol 32 can comprise a "−" sign denoting the side of LED device 10 comprising the negative electrode terminal. Either first or second symbol 30 or 32 may be used alone. One or more test points 34 can be located adjacent either a positive or negative side of the device for testing the electrical and/or thermal properties of the LED device 10. In one aspect, test point 34 can be disposed adjacent the positive side, or terminal of LED device 10.

Figure 2:
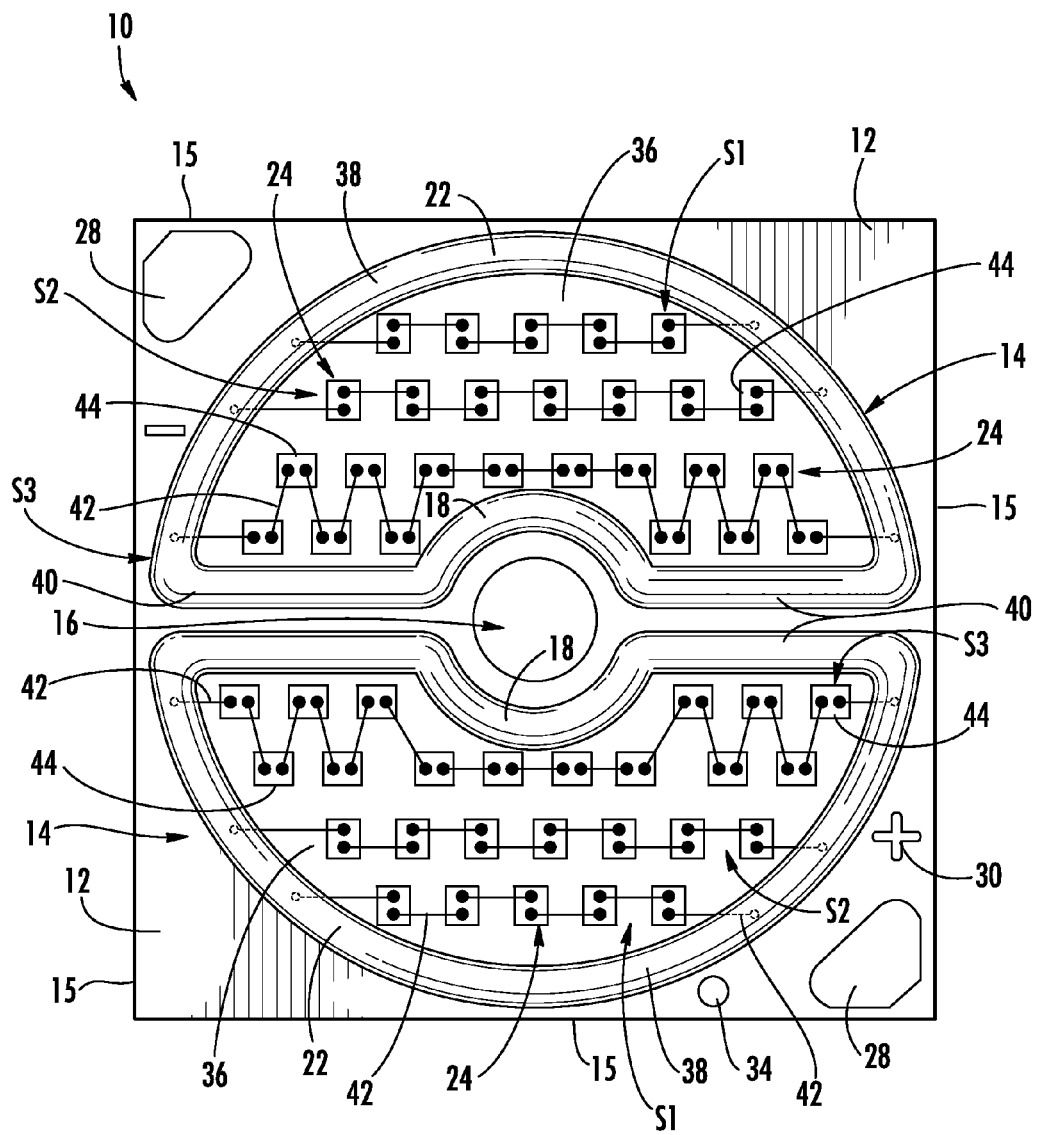
FIG. 2 is a top plan view of an embodiment of an LED device according to the disclosure herein.

FIG. 2 is a top plan view of a first embodiment of LED device 10 where emission area 14 does not yet contain filling material 26. Retention material 22 can be disposed about an irregularly shaped LED mounting area 36 upon which one or more LEDs 24 are mounted and/or attached. In one aspect, mounting area 36 can comprise an irregular shape substantially corresponding to the shape of retention material 22. In one aspect, retention material 22 can be disposed about and generally follow the shape of irregularly shaped mounting area 36. In other aspects, retention material 22 can comprise any other irregular shape either the same and/or different than that of mounting area 36. For example, retention material 22 could extend in any other irregular configuration about mounting area 36. Mounting area 36 can comprise any electrically and/or thermally conductive material. In one aspect, mounting area 36 can comprise a thermally conductive material such as aluminum nitride (AlN) which can have a coefficient of thermal expansion similar to that of the one or more LEDs 24. Mounting area 36 can comprise a reflective material and/or be coated with a reflective material, for example and without limitation, white reflective material or titanium dioxide ($TiO_2$). Retention material 22 can further be disposed about at least a portion of emission area 14. Retention material 22 can comprise an irregular shape having both straight and curved sides. Retention material 22 can comprise a thickness that can vary to any suitable height for retaining an encapsulant or filling material 26 (FIGS. 7A and 7B). FIG. 2 illustrates, for example and without limitation, retention material 22 comprising at least one curved side 38 that can curve to extend at least proximate to one or more edges 15 of submount 12. In one aspect, curved side 38 can oppose one or more concave portions 18. One or more straight sides 40 can be disposed between opposing curved side 38 and concave portion, for example, and can disposed at an angle with respect to curved side 38. However, any configuration of irregularly shaped retention material 22 and mounting area 36 are hereby contemplated, so long as the shape does not have all sides and all angles equal.

Retention material 22 can be dispensed, positioned or otherwise placed over submount 12 and can comprise any suitable size and/or shape. Retention material 22 can comprise any suitable reflective material and can comprise a clear or opaque white material such as, for example, a silicone or epoxy material. Filler particles such as titanium dioxide ($TiO_2$), for example, can be used and added to retention material 22 for providing an opaque material. Retention material 22 can be dispensed or deposited about mounting area 36 using any suitable dispensing technique, for example, by using an automated dispensing machine where any suitable size and/or shape of dam can be formed. Any combination of desired shape and cross-sectional shape of retention material 22 is contemplated. In one aspect, retention material 22 can comprise a rounded cross-sectional shape such that the upper surface of retention material 22 opposite submount 12 is rounded. A rounded or curved cross-section of retention material 22 may further improve the amount of light reflected by LED device 10.

Retention material 22 can comprise any material known in the art, for example, a silicone material comprising 7% fumed silica+3% $TiO_2$+methyl silicone. As illustrated in FIG. 2, retention material 22 can be dispensed after wirebonding of the one or more LEDs 24 such that retention material 22 is disposed over and at least partially covers wirebonds 42 to contain at least a portion, such as one end of each of wirebonds 42 within retention material 22. Wirebonds 42 connecting the first and last, or outermost edge LEDs 44 for a given set or string of LEDs can be disposed within retention material 22. That is, in one aspect, each of the one or more emission areas 14 can comprise a single, undivided LED mounting area 36 in which outermost LEDs 44 may be wirebonded to electrical elements disposed under retention material 22. Outermost wirebonds 42 can thereby be at least partially disposed within retention material 22. In one aspect, mounting area 36 can comprise a thermally conductive but electrically insulating material. In other aspects, mounting area 36 can comprise a thermally conductive and electrically conductive material. Wirebonding LEDs 24 is not necessary, however, as described further regarding FIG. 3. Retention material 22 can be "planed" during dispersion at room temperature for accurate volume and/or height control. The addition of $TiO_2$ can increase reflection about the emission area 14 to further to optimize light emission of LED device 10. Fumed silica can be added as a thixotropic agent. Dispersing retention material 22 can allow for irregular shapes which can extend, curve, or otherwise conform to any shape over a submount or mounting surface thereby increasing the amount of space available to emit light, Dispensing retention material 22 may also allow LED device 10 to withstand higher voltages.

Still referring to FIG. 2, LEDs 24 can be arranged, disposed, or mounted over a thermally conductive LED mounting area or pad 36. LEDs 24 can be arranged or disposed in strings of LEDs 24 that can comprise LEDs electrically connected in series or any other suitable configuration. More than one string of LEDs 24 can be provided, and each string of LEDs 24 can be arranged in parallel to one or more other strings of LEDs 24. LEDs 24 in any given string of LEDs 24 can be arranged in any suitable pattern or configuration, and even LEDs 24 within a given set or string of LEDs can be arranged or disposed in one or more different patterns or configurations. Such patterns may include LEDs 24 arranged in series or parallel configurations, or combinations thereof. For LEDs 24 comprising bond pads, retention material 22 can at least partially cover one or more wirebonds 42 of outermost LEDs 44. FIG. 2 illustrates at least three strings of LEDs 24 arranged in each emission area 14. LEDs 24 can be arranged in more than one different pattern. For example, a first string of LEDs 24, generally designated S1, can comprise a straight line of LEDs 24 electrically connected in series. Each LED 24 in string S1 can be spaced equidistance from neighboring LEDs 24. A longitudinal axis for each of the LEDs 24 in string S1 can be at least substantially parallel. The longitudinal axis for each of the LEDs 24 can be substantially perpendicular the direction of wirebonds 42. A second string of LEDs 24, generally designated S2, can comprise the same or a different pattern than string S1. FIG. 2 illustrates string S2 having the same pattern as string S1, however the LEDs 24 of string S2 can be staggered with respect to the LEDs 24 in string S1. That is, LEDs 24 of string S2 can be offset in alignment to LEDs 24 of string S1. The staggered arrangement between strings can optimize light extraction from emission area 14 and reduce the amount of light absorbed or blocked by neighboring LEDs 24 and/or LEDs 24 of adjacent strings.

A third string generally designated S3 of a given emission area 14 can comprise a combination of more than one pattern. For example, string S3 can comprise a substantially checkerboard pattern consisting of more than one row of LEDs 24 electrically connected in series. The rows can comprise a staggered, substantially checkerboard pattern. String S3 can comprise a different pattern adjacent concave portion 18 of retaining material 22 thereby adjusting to the irregular shaped LED mounting area 36 and retention material 22. The pattern of string S3 adjacent concave portion 18 can comprise a straight line pattern design where each LED 24 is spaced substantially parallel and equidistance apart from neighboring LEDs 24. The longitudinal axis of each LED 24 can be substantially parallel to the direction of the wirebonds 42. Each string S1, S2, and S3 can comprise any suitable number of LEDs 24, for example, greater than two LEDs 24. For example, string S1 can as shown comprise five LEDs 24 electrically connected in series, string S2 can comprise seven LEDs 24 electrically connected in series, and string S3 can comprise 14 LEDs 24 electrically connected in series. Each emission area 14 can comprise any suitable number of total LEDs 24. In one aspect, the more than one emission areas 14 can comprise mirror images having the same shape, number of LEDs 24, number of strings, pattern designs, and total number of LEDs 24. In the alternative, different emission areas 14 can comprise a different shape, different number of LEDs 24 per string and per area, different number of strings of LEDs 24, and different pattern designs of LEDs 24. For illustration purposes, string S3 is illustrated as comprising a combination of two patterns, when in fact, a given string of LEDs 24 can comprise a combination of having more than two patterns. Any suitable number of patterns per emission area 14 and/or per string of LEDs 24 can be utilized.

Spacing between strings and/or combination of patterns within strings of LEDs 24 can optimize light emission and device brightness. Alternating, or staggered LEDs 24 between strings can optimize light output by ensuring uniform coverage and spatial alignment over conducting pad 36 such that light emission is uniform and improved. Strings of LEDs 24 can comprise diodes of the same and/or different colors, or wavelength bins, and different colors of phosphors can be used in the filling material 26 (FIGS. 7A and 7B) in order to achieve emitted light of a desired wavelength. The one or more patterns of LEDs 24 can comprise an array of LEDs 24 within each emission area 14. Each string of LEDs 24 can comprise any suitable number of LEDs 24 electrically connected between outermost LEDs 44 which can connect to respective electrical elements. The arrangements, patterns, and/or combination of multiple patterns herein can comprise an array for optimizing color uniformity and brightness of light emitted from LED device 10. Care must be taken when connecting LEDs 24 in series such that the positive or negative electrode of a preceding LED electrically connects to an electrode of opposite electrical polarity for a subsequent LED for allowing electrical current to flow properly through the string of LEDs 24. As described further below, outermost LEDs 44 can electrically connect to first and second electrical elements, such as conductive traces for receiving and transmitting electrical current or signal through and illuminating a given string of LEDs 24 (FIG. 4).

Figure 3:
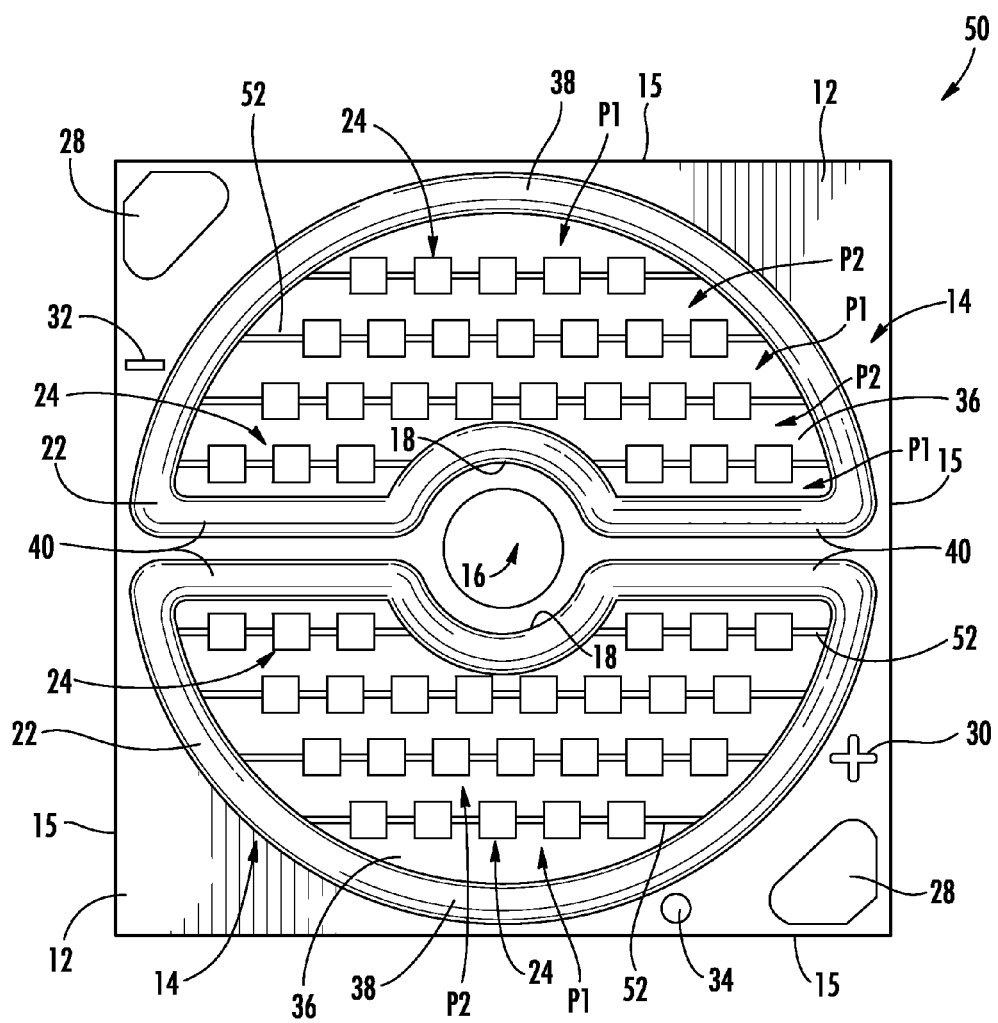
FIG. 3 is a top plan view of an embodiment of an LED device according to the disclosure herein.

FIG. 3 is a top plan view of a second embodiment of LED device, generally designated 50, where emission area 14 does not yet contain filling material 26. LED device 50 can be similar in form and function to LED device 10, however the LEDs 24 do not have bond pads and are not electrically connected in series via wirebonds 42. Rather, LED mounting area 36 can further comprise an isolating layer 52 which can be form integral with mounting area 36. As described earlier, LEDs 24 can comprise vertical or horizontal chip structures. Here, LEDs 24 can comprise a horizontal chip structure with each of the p- and n-type layers disposed on the bottom of the chip. The p- and n-type layers can electrically communicate with LED mounting area 36 to receive electrical current. Isolating layer 52 can electrically isolate electrically conductive portions of mounting area 36 such that first portions P1 of mounting area 36 comprise a cathode and second portions P2 of mounting area 36 serve as an anode which can supply electrical current to the one or more LEDs 24 thereby illuminating, the LEDs.

Isolating layer 52 can comprise any suitable material capable of electrically and thermally isolating portions of mounting area 36. For example, isolating layer 52 can comprise an insulating or dielectric layer which can be configured to electrically and thermally isolate more than one portion of mounting area 36. For example, upon isolation, the one or more portions of mounting area 36 disposed on either side of isolating area, P1 and P2 can comprise an anode and/or cathode for illuminating LEDs 24. Isolating layer 52 can be formed by using any suitable process known in the art, for example by subjecting at least a portion of mounting area 36 to an anodizing, oxidizing, or a passivation process capable of forming an isolating layer in mounting area 36. In one aspect, mounting area 36 can be formed integral as a portion of submount 12 and submount 12 can undergo one or more of these processes to create isolating layer 52 prior to, upon, or after formation of the submount 12. In other aspects, mounting area 36 is attached to submount 12 after undergoing a process which forms insulating portion 52, for example, passivation.

In one aspect, mounting area 36 and isolating layer 52 can comprise the same material, wherein isolating layer 52 forms by an anodizing, oxidizing, or a passivation process. By having mounting area 36 and isolating layer 52 formed from the same submount of material, manufacturing costs can be decreased by eliminating extraneous components such as separately formed conductive traces. Eliminating conductive traces can also maximize mounting area 36 thereby further increasing size of emission area 14 and better utilizing space on submounts 12 subjected to tight dimensional requirements. Just as in LED device 10, LED device 50 can comprise more than one emission area 14 wherein the corresponding mounting area 36 comprises an irregular shape. This can further utilize space and allow emission areas 14 to be larger on submounts 12 having tight dimensional requirements as emission areas 14 can extend around attachment areas 16. Retention material 22 which can be dispensed about mounting area 36 can also comprise an irregular shape. LED device 50 can also comprise one or more attachment surfaces 28 adapted to supply power to the one or more LEDs 12. For example, attachment surfaces 28 may comprise solder pads or surfaces adapted to receive electrical current from external sources such as electrical wires (not shown). Attachment surfaces 28 can electrically communicate with portions mounting area 36 to supply the electrical current to LEDs 24 when mounting area 36 is isolated via isolating layer 52.

As FIG. 3 illustrates, LEDs 24 can be positioned or arranged in an array. Each LED 24 can be electrically connected in parallel, as the LEDs receive electrical current from first and second portions P1 and P2 of mounting area 36. The array can comprise a reticulated array wherein each subsequent row is staggered or offset from the previous row. This can increase the uniformity of light emitted from emission area and can minimize the amount of light absorbed or blocked from adjacent LEDs 24. Each emission area 14 can comprise a single, undivided area having at least two electrically and/or thermally isolated portions. Emission area 14 can comprise any shape, and can comprise any suitable number of LEDs 24.

FIG. 4 illustrates LED device 10 comprising submount 12 prior to arranging, dispensing, or otherwise placing retention material 22 about at least a portion of one or more emission areas 14. For illustration purposes, only a first string of LEDs 24 is illustrated, however, as noted earlier, emission area can comprise more than one strings of LEDs 24 electrically connected in series. As illustrated, an electrostatic discharge (ESD) protection device, for example, at least one Zener diode 62 can be positioned on a mounting area between conductive traces and can be reversed biased with respect to the strings of LEDs 24. Zener diode 62 can protect against ESD failures. As Zener diodes 62 can comprise black chips, they typically absorb light. Placing the at least one Zener diode 62 below retention material 44 is advantageous as it can further improve light intensity from LED device. In one aspect, two Zener diodes 62 can be electrically connected in series using one or more wirebonds 42 between first and second conductive traces 64 and 66 for higher voltage applications. Each emission area 14 can be disposed between first and second conductive traces 64 and 66 of submount 12. First conductive traces 64 can correspond to the negative portion of LED device 10 as designated by symbol 32. Second conductive traces 66 can correspond to the positive terminal of LED device 10 as designated by symbol 30. Conductive traces can, for example and without limitation, be arranged in a substantially semi-circular arrangement about mounting area 36 such that outermost LEDs 24 arranged in strings over mounting area 36 can electrically communicate to each trace by wirebonding via wirebonds 42 or by any other suitable attachment method. As illustrated, outermost LEDs 44 for a respective string of LEDs 24 can electrically connect to conductive traces 64 and 66.

Broken lines 68 illustrate one possible aspect of the size and/or shape of the electrically conductive material comprising the conductive traces 33 and 34. The lines are broken to illustrate how the material can be disposed under a solder mask 102 (FIG. 7A). Thus, attachment surfaces 28 can electrically and/or thermally communicate with respective conductive traces 64 and 66 and can comprise the same layer of material. External, conductive wires (not shown) can electrically connect to attachment surfaces 28, and electrical current or signal can flow from the attachment surfaces 28 to the respective conductive traces 64 and 66. The electrical current can flow along the conducting material designated by broken lines 68 disposed below the layer of solder mask 102. The electrical current can flow into and/or out of the conductive traces 64 and 66 and therefore into and out of respective strings of LEDs 24 mounted over mounting area 36. Mounting area 36 can comprise an irregular shape that can extend around various feature of LED device 10, for example, attachment area 16 to thereby expand the size of emission area 14. FIG. 4 also illustrates one possible location for mounting area 36. That is, mounting area 36 can comprise an off-centered location with respect to submount 12, but a substantially centrally located semi-circular pad disposed between conductive traces 64 and 66. Solder mask 102 (FIG. 7A) can be disposed at least partially between respective conductive traces 64 and 66 mounting area 36, such that the solder mask 32 comprises a substantially semi-circular arrangement about mounting area 36. Solder mask 32 can also be disposed in areas outside of the conductive traces, for example, between the respective conductive traces and one or more attachment surfaces 28.

Figure 5:
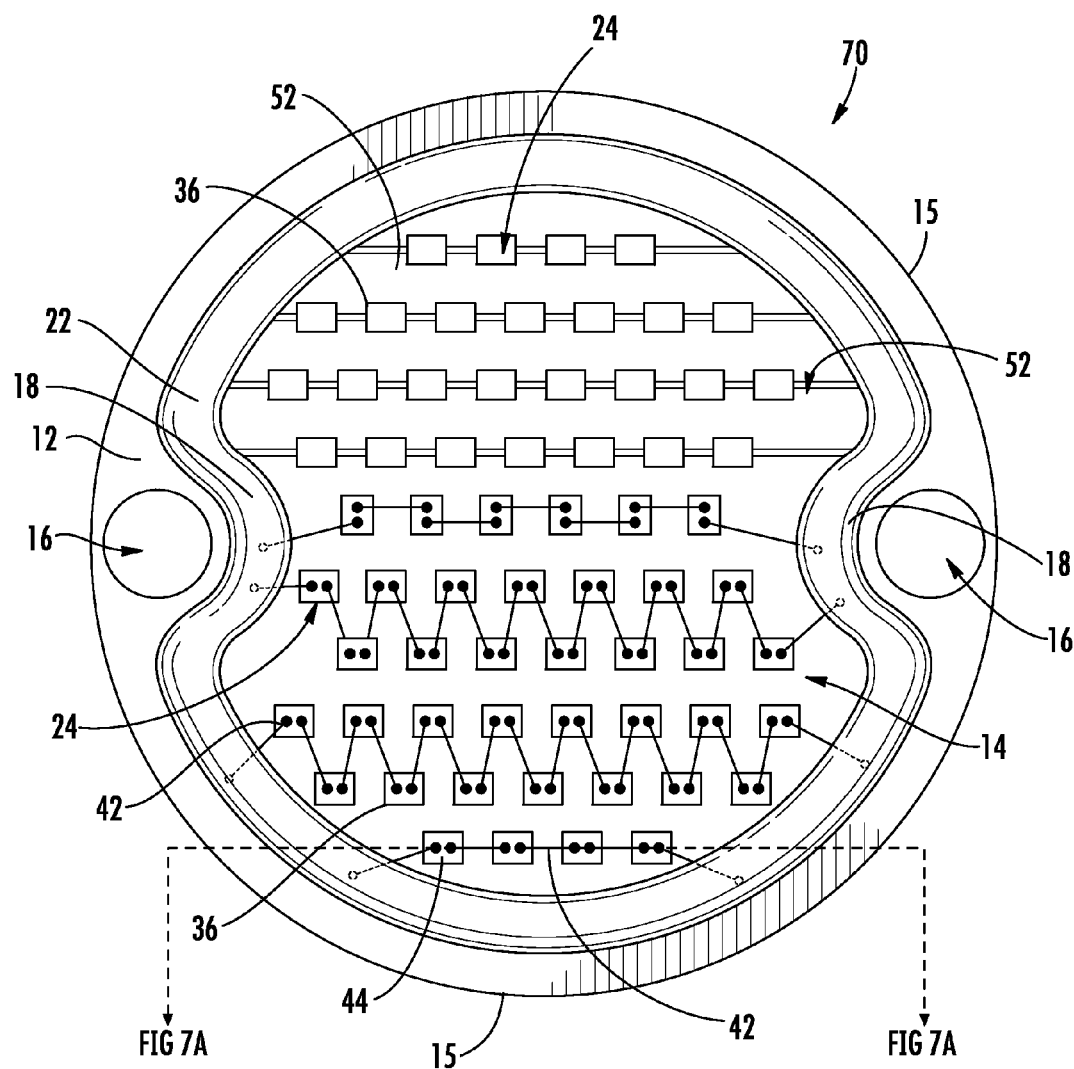
FIG. 5 if a top plan view of an embodiment of an LED device according to the disclosure herein.

FIG. 5 illustrates a further embodiment of an LED device, generally designated 70 prior to placement of filling material 26. LED device 70 illustrates another example of a device having an irregularly shaped mounting area 36 and retention material 22 disposed about mounting area 36. LED device 70 comprises a rounded submount 12 over which an irregularly shaped emission area 14 can be disposed. Emission area 14 can comprise an irregularly shaped mounting area 36, one or more LEDs 24 and filling material 26 (not shown). Filling material 26 can react with light emitted from the one or more LEDs 24 such that light of a desired wavelength is emitted. In one aspect, what is perceived as white light is emitted from emission area 14 of LED device 70 and each device described herein. LED device 70 can comprise more than one attachment area 16. Retention material 22 and emission area 14 can comprise one or more concave portions 18 for extending around attachment areas 16. Irregularly shaping emission area 14 can maximize the space from which light can be emitted, for example, extending the area proximate edge 15 of submount.

One or more LEDs 24 may be disposed in an array over surface of submount 12. LEDs 24 can comprise horizontal devices having the p- and n-contacts on the top surface such that the LEDs 24 can be electrically connected in series via wirebonds 42. LEDs 24 that are wirebonded can comprise one or more strings of LEDs 24. In the alternative, LEDs 24 can comprise horizontal devices having both the p- and n-contacts on the bottom in the so-called flip chip design and can be electrically connected in parallel over an electrically conductive mounting area 36 that has been electrically isolated into more than one portion by isolating layer 52. For illustration purposes, both LED 24 connection methods and chip structures are indicated, however, any suitable connection method and chip structure is contemplated. Each LED 24 in emission area may be wirebonded in strings via wirebonds 42, each may be flip chip oriented, or emission area 14 can comprise a combination of both. Strings of LEDs 24 may comprise one or more patterns of any orientation and design. Outermost LEDs 44 of wirebonded strings may comprise wirebonds 42 which become at least partially covered by retention material 22.

Figure 6:
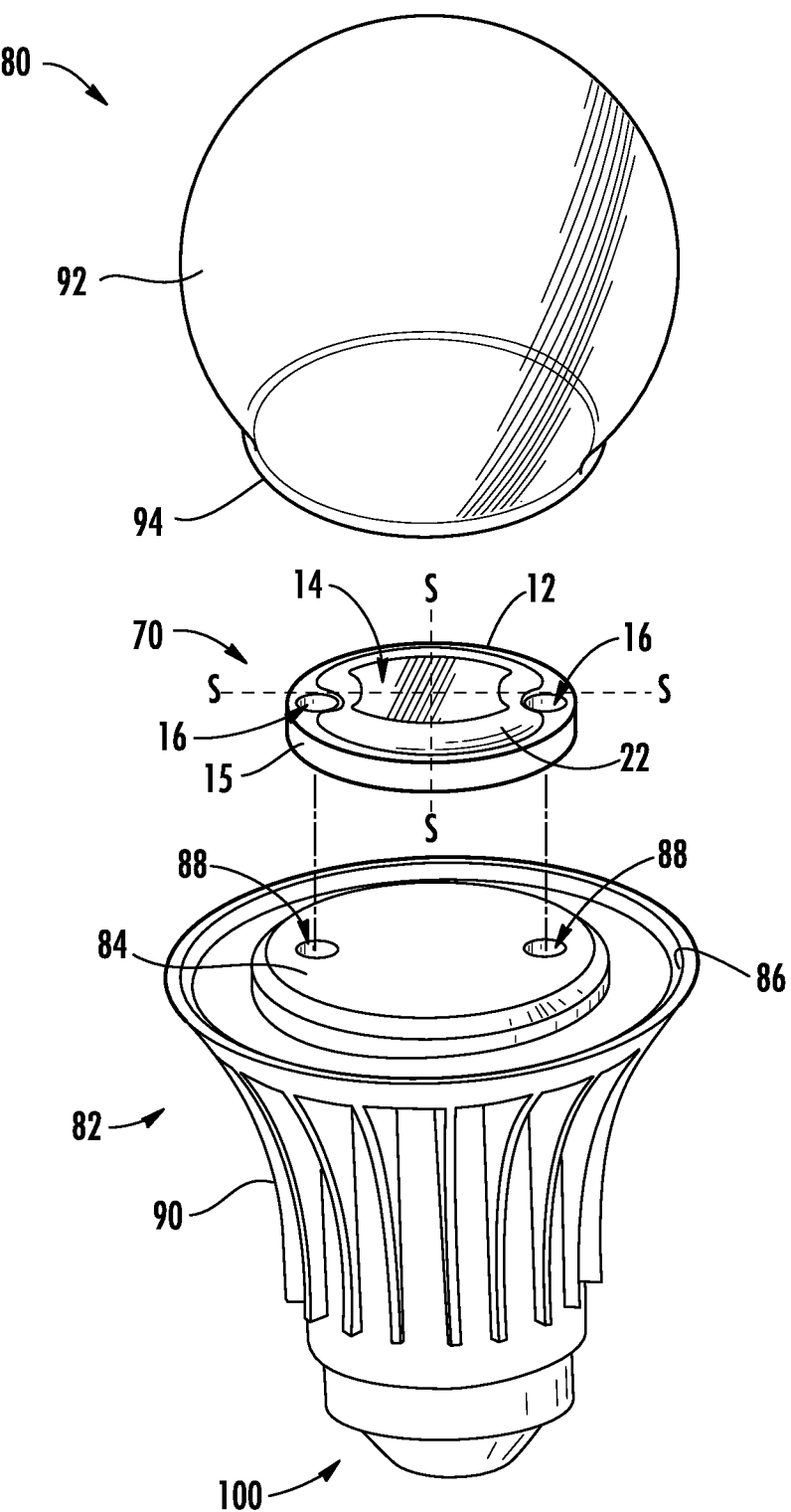
FIG. 6 is a perspective view of one embodiment of an LED system according to the disclosure herein.

FIG. 6 illustrates one example of an LED system, generally designated 80. LED system 80 can comprise an LED lighting product for any general lighting application. Here, LED system 80 comprises a standard A19 equivalent light bulb. However, any suitable lighting product for any suitable lighting application is contemplated. LED system 80 can comprise LED device 70 disposed over a device housing generally designated 82 which can house electrical components used to illuminate LED device 70. LED device 70 can comprise an emission area 14 that is irregularly shaped, in some aspects LED device 70 can comprise more than one line of symmetry S. In other aspects, LED device 70 can have no more than one line of symmetry S or can be asymmetric. Submount 12 of LED device 70 can be directly mounted over a thermally conductive portion 84 of housing 82, or LED device 70 may not require a submount 12, but could be formed directly on thermally conductive portion 84 of housing 82 (See FIG. 7B). In one aspect, one or more connecting members (not shown) such as a clip or screw may be positioned with one or more attachment areas 16 of LED device 70 for connecting submount 12 to housing 82. The connecting members could extend through device 70 and become mechanically retained by one or more coupling members 88 of housing 82. In one aspect, coupling members 88 comprise openings through which the connecting member could extend thereby coupling device 70 to housing 82. In another aspect, coupling member 88 comprises an electrically conductive pad or portion to which one or more LEDs 24 of device 70 can electrically couple to thereby electrically coupling device 70 to housing. Coupling members 88 can therefore represent portions of housing which could electrically, thermally, and/or mechanically couple device 70 to housing 82.

Housing 82 further comprises an inner wall 86 disposed about thermally conductive portion 84. Inner wall 86 can couple to a bulb for fitting with LED device 70. Thermally conductive portion 84 can be disposed over an upper surface 88 of housing. One or more fins 90 can be disposed on housing 82. Fins 90 can increase the surface area from which heat can dissipate when LED device 70 thermally couples to housing 82. A bottom portion of housing, generally designated 100, can comprise a socket which can receive electrical current from an external source, for example, a lamp socket when a power switch for the system is turned "on". When "on", electrical current can flow through housing 82 in any suitable configuration and be received by LED device 70. LED device 70 can illuminate via emission area 14 which can transmit light through a bulb 92. System 80 can further comprise a bulb 92 positioned over housing 82, wherein a lower rim 94 of bulb 92 can be secured to inner wall 86 of housing 82. Bulb 92 can be transparent, semitransparent, opaque, and/or any combination thereof. In other embodiments, bulb 92 can comprise any suitable shape than the pear shape (A19 size/shape) as illustrated. Any size and/or shape of bulb 92 and LED system 80 is hereby contemplated.

FIGS. 7A and 7B illustrate cross-sectional views of LED device 70 both on and off a submount 12. FIG. 7A illustrates a portion of a cross-section of FIG. 5 with filling material 26 disposed over emission area 14. For illustration purposes, LEDs 24 that are wirebonded and electrically connected in series are illustrated. As noted, LEDs 24 could also comprise a chip structure that does not need bond pads and/or wirebonds 42. Such structures may simply be mounted over electrically isolated portions of mounting area 36. As noted, each string, or pattern of LEDs 24 can comprise any suitable number of LEDs 24. LEDs 24 can be arranged over mounting area 36 and can thermally communicate directly with mounting area 36 or indirectly through one or more intervening layers. LEDs 24 can attach to mounting area 36 or intervening layers using any attachment means known in art. In one aspect, LEDs 24 can attach using solder pastes, epoxies, or flux. Mounting area 36 can be formed integral as one piece of submount 12 or can comprise a separate layer disposed over submount 12. Mounting area 36 can dissipate heat generated by the one or more LEDs 24.

FIG. 7A further illustrates outermost LEDs 44 electrically communicating with one or more electrical elements via wirebonds 42. Electrical elements can comprise first and second conductive traces 64 and 66 which are configured to flow, or supply electrical signal or current to the respective strings of LEDs 24. One of first and second conductive traces 64 and 66 can comprise an anode and the other a cathode. The electrical polarity can be denoted by first and second symbols 30 and 32 (FIG. 1) as discussed earlier. Mounting area 36 and conductive traces 64 and 66 can comprise any suitable electrical and thermally conductive materials and can comprise either the same or different materials. In one aspect, mounting area 36 and conductive traces can comprise a layer of copper (Cu) or aluminum (Al) metal or alloy material deposited over submount using any suitable technique. An electrically insulating solder mask 102 can be disposed at least partially between mounting area 36 and respective conductive traces 64 and 66 such that when solder or other attachment material is used to attach one or more LEDs 24 over mounting area 36, the attachment material cannot electrically communicate with the conductive traces 64 and 66 thereby causing one or more strings of LEDs 24 to become electrically shorted.

FIG. 7A further illustrates various other portions of submount 12. Submount 12 can comprise, for example, mounting area 36, first and second conductive traces 64 and 66, and solder mask 102 at least partially disposed between mounting area 36 and each of conductive traces 64 and/or 66. Solder mask 102 can be disposed between conductive traces 64 and 66 and attachment surfaces 28 (FIG. 4), the proximal edges of solder mask can be seen in FIG. 7A adjacent an outer wall 108 of retention material 22. Submount 12 can further comprise a dielectric layer 104, and a core layer 106. For illustration purposes, submount 12 can comprise a MCPCB, for example, those available and manufactured by The Bergquist Company of Chanhassan, Minn. Any suitable submount 12 can be used, or in some aspect, no submount is necessary (FIG. 7B). Core layer 106 can comprise a conductive metal layer or alloy, for example copper or aluminum. Dielectric layer 104 can comprise an electrically insulating but thermally conductive material to assist with heat dissipation through submount 12. Retention material 22 can at least partially cover each of solder mask 32 and the wirebond 42 connecting outermost LEDs 44 to conductive traces 64 and 66. Filling material 26 can be selectively filled to any suitable level higher, lower, or equal to the height of retention material 22. Wirebonds 42 of the outermost LEDs 44 as shown can be at least partially disposed within retention material 22.

FIG. 7B illustrates LED device 70 without a submount 12. For example, a string of one or more LEDs 24 can be directly disposed over a thermally conductive material, such as thermally conductive portion 84 of LED system 80 thereby eliminating the need for submount 12. As noted earlier, coupling members 88 may comprise an area, such as an electrically conductive pad which could electrically couple housing 82 to device 70. Thus, LEDs 24 can be directly mounted over thermally conductive portion 84 and electrically communicate with coupling members 88. LEDs 24 may be mounted over any suitable thermally conductive material and electrically coupled to any suitable electrically conductive material. Electrically and thermally conductive materials may be disposed on any suitable LED lighting system, product, or fixture. Retention material 22 can then be dispensed in an irregular shape about the LEDs 24 to maximize emission area 14. Retention material 22 can at least partially cover wirebonds 42 of outermost LEDs 44 and thermally conductive portion 84. Filling material 26 can then be filled to any suitable level with respect to thickness of retention material 22. Filling material 26 may be filled to a level even with top of retention material 22 or to any suitable level concave or convex with respect to the top of retention material 22. Notably, FIGS. 7A and 7B illustrate the rounded outer wall 108 of retention material 22. This may be advantageous for further reflecting light emitted from emission area 14.

FIG. 8 illustrates another embodiment of an LED device, generally designated 110. LED device 110 is illustrated without filling material 26 disposed in emission area 14. LED device 110 is similar in form and function to other devices described herein, and can comprise one or more irregularly shaped light emission areas 14 having irregularly shaped retention material 22 at least partially disposed about each emission area 14. LED device 110 illustrates a device comprising four emission areas 14 in an off-center location. Each emission area can comprise one or more LEDs 24 mounted to thermally conductive mounting area 36. In one aspect, LEDs 24 may be electrically connected in series via wirebonds 42 and receive electrical current from electrical traces disposed outside mounting area 36. In other aspects, LEDs 24 may be electrically connected in parallel and receive electrical current from portions of mounting area that have been isolated by isolating layer 52. The four emission areas 14 can be disposed on a submount 12 and utilize an irregular shape to extend proximate edge 15 of submount 12 where a submount is desired. LED devices herein, including LED device 110, may or may not have a submount such as submount 12. Emission areas 14 can be disposed about one or more attachment areas 16. Attachment areas 16 may or may not be centrally disposed with respect to submount. Another advantageous feature obtained by using irregularly shaped emission areas is the ability to obtain certain sizes, shapes, location and pattern of light. For example, lighting applications typically differ by the position and pattern of light required. By using devices, systems, and methods disclosed herein, emission areas 14 can be created over virtually any thermally conductive surface or area by mounting LEDs 24 in any desired irregular shape, dispensing retention material 22 about the LEDs 24, and providing filling material 26 within retention material 22. Electrical current can be supplied to the LEDs 24 using any suitable submount or other electrical configuration. Certain applications may need certain patterns or location of light, thus, any number and pattern of emission areas 14 can then be provided to accommodate any number of applications.

Figure 9:
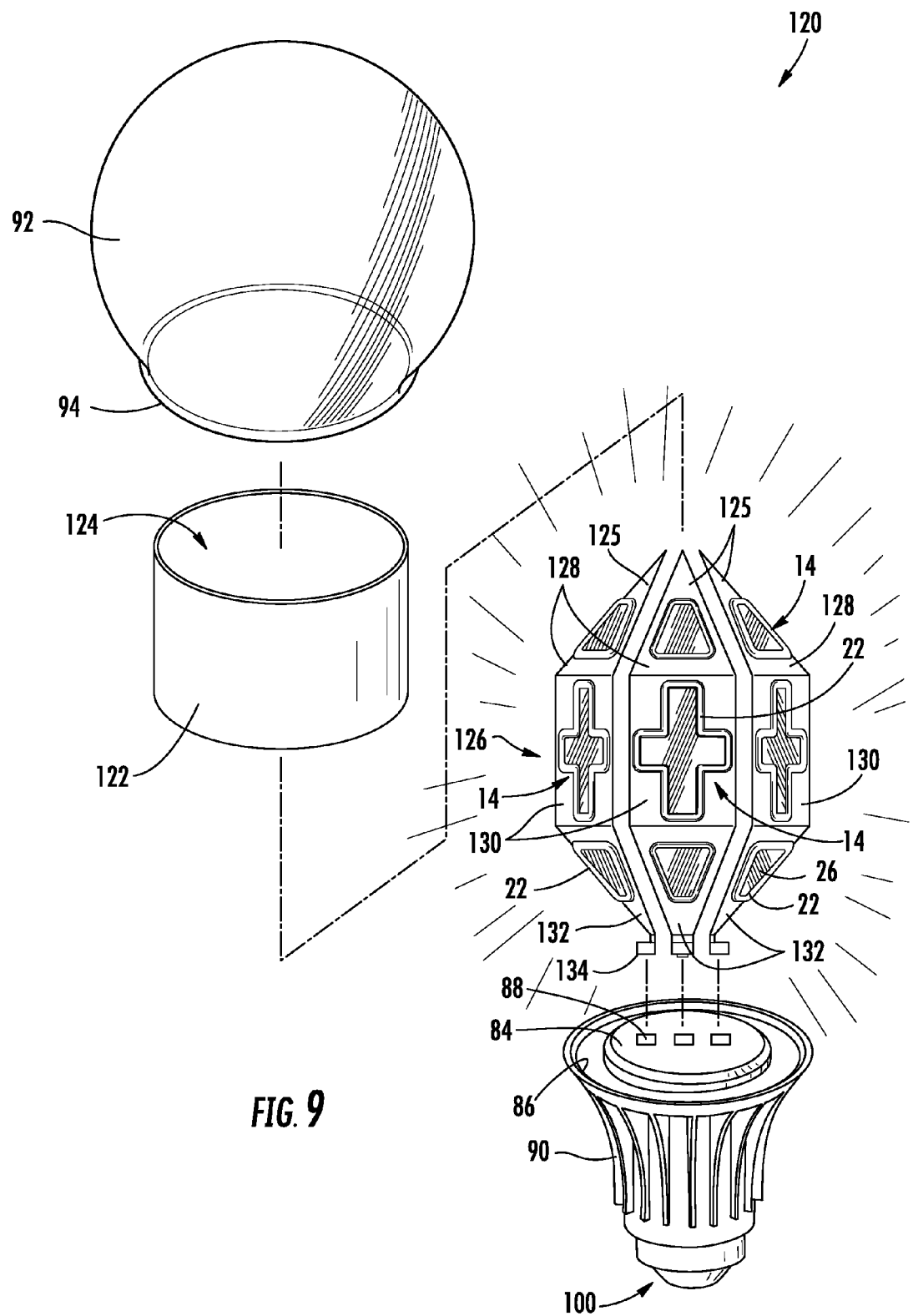
FIG. 9 is a perspective side view of an embodiment of an LED system according to the disclosure herein.

FIG. 9 illustrates another embodiment of an LED system, generally designated 120. System 120 can comprise any suitable lighting product or fixture. System 120 illustrates the ability of using one or more emission areas 14 for establishing various light positions. System 120 illustrates a lighting application that requires light to be emitted in multiple directions, for example, outwardly from bulb 92 along all upper and lower surfaces within bulb 92. System 120 can comprise a three-dimensional LED device, generally designated 126. Device 126 comprises multiple portions 125 adapted to together emit light approximately 360° from inside bulb 92. Each portion 125 can be adjacent another similarly shaped portion 125, and the portions can comprise a hexagonal arrangement to position light approximately 360° around bulb. The side view in FIG. 9 illustrates three portions 125; however, the other three portions would be a mirror image when viewed from the other side.

Each portion 125 of device 126 can comprise multiple surfaces over which emission areas 14 can be provided for emitting light from various angles as indicated by the lines. For example, each portion 125 may comprise a first facet or surface 128, a second surface 130, and a third surface 132. Each of first, second, and third surfaces 128, 130, and 132 can be disposed at different angles with respect to each other. Any suitable number of surfaces and arrangement of surfaces for obtaining any angle of light is hereby contemplated. Each of first, second, and third surfaces 128, 130, and 132, respectively can comprise an irregularly shaped emission area 14 which can maximize the amount of surface from which light may be extracted. Each emission area 14 can comprise one or more LEDs 24 (not shown) disposed within filling material 26 for obtaining light of a desired wavelength. Retention material 22 can be disposed about emission area 14 for retaining filling material 26 over the one or more LEDs 24. (See FIGS. 7A and 7B). Each portion 125 of device 126 can comprise a coupling end 134 for mechanically, electrically, and/or thermally connecting to housing 82, previously described. Housing 82 can comprise one or more coupling members 88 for coupling to portions 125. In one aspect, coupling member 88 comprises a solder pad for soldering to coupling end 134. In other aspects, coupling member 88 comprises an opening for receiving at least a portion of coupling end 134. Any method of electrically, mechanically, and/or thermally coupling housing 82 to device 126 is hereby contemplated.

System 120 may optionally comprise a diffuser 122. A diffuser 122 may comprise an opening 124 through which device 126 may be inserted and/or surrounded to further affect light. Diffuser 122 may ensure even light extraction from bulb 92. Bulb 92 can be disposed about each of device 126 and diffuser 122 where a diffuser is utilized. LED devices and systems disclosed herein can advantageously consume less energy while delivering equal or greater illumination. LED devices and systems disclosed herein can also advantageously maximize the amount of emission area available by utilizing irregularly shaped light emission areas. In addition, LED devices, systems, and methods disclosed herein can advantageously selectively position for a variety of lighting applications.

FIG. 10 illustrates another example of an LED device over which one or more irregularly shaped emission areas 14 can be disposed. LED device can comprise a submount 12. Retention material 22 can be disposed about each of the one or more emission areas 14 via a dispensing process or other suitable process. Emission areas 14 can comprise one or more LEDs 24 disposed under filling material 26 (FIGS. 7A and 7B). A first irregularly shaped device 140 can comprise a parallelogram that is asymmetric. A second irregularly shaped device 150 has no more than one line of symmetry denoted S. A third irregularly shaped device 160 is also asymmetric. Several irregular shapes have been illustrated herein, however, any irregular shape is contemplated and envisioned in accordance with the disclosure herein. As noted earlier, irregular shapes are shapes that do not have all lines and all angles equal.

Embodiments of the present disclosure shown in the drawings and described above are exemplary of numerous embodiments that can be made within the scope of the appended claims. It is contemplated that the configurations of LED devices, systems, and methods of making the same can comprise numerous configurations other than those specifically disclosed.

What is claimed is:

1. A light emitting device, comprising:
   a submount;
   a retention material disposed over the submount, the retention material comprising at least one inner wall that defines an emission area, wherein the retention material and the emission area each comprise an irregular shape, the irregular shape having no more than two lines of symmetry;
   a plurality of light emitting diodes (LEDs) mounted over the emission area; and
   wherein the plurality of LEDs comprises one or more strings of serially connected LEDs arranged in at least two different patterns, wherein at least a first pattern is a non-linear pattern in which adjacent LEDs alternate above and below a horizontal line, and wherein at least a second pattern is a linear pattern that is substantially parallel to the horizontal line.

2. The device of claim 1, wherein the plurality of LEDs are arranged in an array.

3. The device of claim 1, wherein the device comprises more than one emission area.

4. The device of claim 1, wherein a portion of the emission area comprises a concave portion adjacent an attachment area.

5. The device of claim 1, wherein the submount comprises ceramic.

6. The device of claim 1, wherein the emission area is disposed off-center with respect to the submount.

7. The device of claim 1, wherein the retention material is comprises silicone.

8. The device of claim 1, wherein the emission area further comprises a filling material disposed over the plurality of LEDs, the filling material being retained by the retention material.

9. The device of claim 1, wherein the device comprises a first emission area disposed over a first surface of the submount and a second emission area disposed over a second surface of the submount, wherein an angle is disposed between the first and second surfaces for emitting light at different angles.

10. The device of claim 1, wherein at least some of the plurality of LEDs are electrically connected in series via wirebonds.

11. The device of claim 1, wherein at least some of the plurality of LEDs are electrically connected in parallel.

12. The device of claim 1, wherein the device comprises at least four emission areas, each emission area comprising an irregular shape.

13. The device of claim 3, wherein the device further comprises an attachment area at least partially disposed between the more than one emission areas.

14. The device of claim 1, wherein the emission area comprises a single, undivided area.

15. The device of claim 1, wherein the irregular shape comprises no more than one line of symmetry.

16. The device of claim 1, wherein the irregular shape is asymmetric.

17. A light emitting device, comprising:
   a submount;
   a retaining structure disposed over the submount;
   an emission area disposed between a portion of the retaining structure, wherein the emission area comprises an irregular shape having no more than two lines of symmetry; and
   an array of light emitting diodes (LEDs) disposed over the emission area, wherein the array of LEDs comprises at least a first string of serially connected LEDs provided in a first pattern and at least a second string of serially connected LEDs provided in a second pattern that is different than the first pattern, wherein the first pattern is a non-linear pattern in which adjacent LEDs alternate above and below a horizontal line, and wherein the second pattern is a linear pattern that is substantially parallel to the horizontal line; and
   an attachment area disposed outside of the emission area.

18. The device of claim 17 comprising more than one emission area.

19. The device of claim 17 comprising more than one attachment area.

20. The device of claim 17, wherein the array of LEDs comprises three or more strings of serially connected LEDs.

21. The device of claim 17, wherein the retaining structure is reflective.

22. The device of claim 17, wherein the emission area is disposed over a center of the submount.

23. The device of claim 17, wherein the emission area is disposed off-center with respect to the submount.

24. The device of claim 17, wherein the retention material comprises silicone.

25. The device of claim 17, wherein the emission area further comprises a filling material disposed over the array of LEDs, the filling material being retained by the retaining structure.

26. The device of claim 17, wherein the device comprises a first emission area disposed over a first surface of the submount and a second emission area disposed over a second surface of the submount, and wherein an angle is disposed between the first and second surfaces for emitting light at different angles.

27. The device of claim 17, wherein at least some of the LEDs in the array of LEDs are electrically connected in series via wirebonds.

28. The device of claim 27, wherein each LED of the array of LEDs is configured to emit a same color of light.

29. The device of claim 17, wherein at least some LEDs in the array of LEDs are electrically connected in parallel.

30. The device of claim 17, wherein the device comprises at least four emission areas, each emission area comprising an irregular shape.

31. The device of claim 17, wherein the irregular shape comprises no more than one line of symmetry.

32. The device of claim 17, wherein the irregular shape is asymmetric.

33. The device of claim 17, wherein the attachment area comprises an opening.

34. The device of claim 17, wherein the attachment area comprises a clip fastener.

35. A method of providing a light emitting device, the method comprising:
providing a submount;
providing a retention material over the submount, the retention material comprising at least one inner wall that defines an emission area, wherein the retention material and the emission area each comprise an irregular shape, the irregular shape having no more than two lines of symmetry;
providing a plurality of light emitting diodes (LEDs) mounted over the emission area;
serially connecting the plurality of LEDs in one or more strings of LEDs arranged in at least two different patterns, wherein at least a first pattern is a non-linear pattern in which adjacent LEDs alternate above and below a horizontal line, and wherein at least a second pattern is a linear pattern that is substantially parallel to the horizontal line.

36. The method of claim 35, further comprising providing a filling material between portions of the at least one inner wall of the retention material.

37. The method of claim 35, wherein the submount comprises ceramic.

38. The method of claim 37, further comprising providing the submount within an LED bulb.

39. The method of claim 35, wherein providing the plurality of LEDs comprises providing an array of LEDs.

40. The method of claim 35, comprising providing multiple emission areas over the submount.

41. The method of claim 35, comprising providing the emission area with one or more concave portions adjacent an attachment area.

42. The method of claim 35, wherein providing retention material comprises dispensing retention material.

43. The method of claim 35, further comprising providing first and second emission areas, wherein the first emission area is disposed over a first surface of the submount and a second emission area is disposed over a second surface of the submount, where the second surface is angled with respect to the first surface.

44. The method of claim 35, wherein serially connecting the plurality of LEDs comprises electrically connecting adjacent LEDs of the plurality of LEDs via wirebonds.

45. The method of claim 35, wherein providing the plurality of LEDs comprises providing at least some LEDs that are configured to emit blue light and at least some LEDs that are configured to emit red light.

46. The method of claim 35, further comprising providing an attachment area disposed outside of the emission area.

47. A light emitting device, comprising:
a submount comprising at least a first planar surface;
a plurality of light emitting diodes (LEDs) attached to the first planar surface of the submount, wherein at least some of the LEDs are disposed in a non-linear pattern in which adjacent LEDs alternate above and below a horizontal line; and
a retention material attached to the first planar surface of the submount, the retention material, from a plan view of the first planar surface, forming an asymmetric shape over the first planar surface and around the plurality of LEDs.

48. The device of claim 47, wherein at least some of the plurality of LEDs are serially connected in a first string of LEDs, wherein one portion of the first string comprises LEDs arranged in a substantially straight line and another portion of the first string comprises LEDs that are staggered with respect to the substantially straight line.

49. The device of claim 47, wherein an asymmetrically shaped mounting area is disposed below the plurality of LEDs and between at least one inner wall of the retention material.

50. The device of claim 47, wherein the retention material comprises silicone.

51. The device of claim 47, wherein the plurality of LEDs are mounted over the submount for forming one or more emission areas.

52. The device of claim 51, wherein the device comprises more than one emission area.

53. The device of claim 51, wherein the emission area is disposed off-center with respect to the submount.

54. The device of claim 51, wherein the emission area comprises a filling material disposed over at least some of the plurality of LEDs, the filling material being retained by the retention material.

* * * * *